United States Patent
Kato et al.

(10) Patent No.: US 9,680,124 B2
(45) Date of Patent: Jun. 13, 2017

(54) ORGANIC ELECTROLUMINESCENT DEVICE, ILLUMINATION APPARATUS, AND ILLUMINATION SYSTEM

(71) Applicant: Kabushiki Kaisha Toshiba, Minato-ku (JP)

(72) Inventors: Daimotsu Kato, Fuchu (JP); Hayato Kakizoe, Kawasaki (JP); Tomoaki Sawabe, Sumida (JP); Keiji Sugi, Fujisawa (JP); Atsushi Wada, Kawasaki (JP); Yukitami Mizuno, Ota (JP); Tomio Ono, Yokohama (JP); Shintaro Enomoto, Yokohama (JP); Tomoko Sugizaki, Kawasaki (JP); Akio Amano, Machida (JP); Yasushi Shinjo, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 12 days.

(21) Appl. No.: 14/815,541

(22) Filed: Jul. 31, 2015

(65) Prior Publication Data

US 2015/0340643 A1 Nov. 26, 2015

Related U.S. Application Data

(63) Continuation of application No. PCT/JP2013/079610, filed on Oct. 31, 2013.

(30) Foreign Application Priority Data

Feb. 4, 2013 (JP) .................................. 2013-019962
May 17, 2013 (JP) .................................. 2013-105482

(51) Int. Cl.
*H01L 51/52* (2006.01)
*H01L 27/32* (2006.01)
(Continued)

(52) U.S. Cl.
CPC ...... *H01L 51/5225* (2013.01); *H01L 27/3202* (2013.01); *H01L 51/0096* (2013.01);
(Continued)

(58) Field of Classification Search
CPC ......... H01L 2251/5361; H01L 51/5218; H01L 51/5221; H01L 51/5271; H01L 51/5203;
(Continued)

(56) References Cited

U.S. PATENT DOCUMENTS 7,495,388 B2 * 2/2009 Chung ................ H01L 27/3223
 313/504
7,652,646 B2 * 1/2010 Lin ...................... G09G 3/2014
 345/204

(Continued)

FOREIGN PATENT DOCUMENTS

JP 2003-217865 A 7/2003
JP 2011-249541 A 12/2011
(Continued)

OTHER PUBLICATIONS

Combined Office Action and Search Report issued Nov. 4, 2015 in Taiwanese Patent Application No. 102141675 (with English translation).

(Continued)

*Primary Examiner* — Vibol Tan
(74) *Attorney, Agent, or Firm* — Oblon, McClelland, Maier & Neustadt, L.L.P.

(57) ABSTRACT

An organic electroluminescent device includes first and second electrode and an organic light emitting layer. The first electrode has an upper face. The organic light emitting layer is provided on the first electrode. The second electrode is provided on the organic light emitting layer. The second electrode includes a plurality of conductive parts. The conductive parts extend in a first direction parallel to the upper (Continued)

face and are arranged in a second direction. The second direction is parallel to the upper face and intersects with the first direction. When a length of each of the conductive parts in the second direction is set to W1 (micrometer), and a pitch of each of the conductive parts is set to P1 (micrometer). The W1 and the P1 satisfy a relationship of $W1 \geq -647(1-W1/P1)+511$ and a relationship of $W1 \leq -882(1-W1/P1)+847$.

18 Claims, 24 Drawing Sheets

(51) Int. Cl.
*H01L 51/00* (2006.01)
*H05B 33/08* (2006.01)
*H01L 51/50* (2006.01)

(52) U.S. Cl.
CPC ............ *H01L 51/50* (2013.01); *H01L 51/524* (2013.01); *H01L 51/5215* (2013.01); *H01L 51/5221* (2013.01); *H01L 51/5271* (2013.01); *H05B 33/0896* (2013.01); *H01L 2251/5361* (2013.01)

(58) Field of Classification Search
CPC ............. H01L 27/3276; H01L 51/5012; H01L 27/3258; H01L 27/3204; H01L 27/3202; H01L 27/3225; H05B 33/0896; H05B 33/06; H05B 33/10; H05B 33/22
See application file for complete search history.

(56) References Cited

U.S. PATENT DOCUMENTS

| | | | | |
|---|---|---|---|---|
| 8,129,903 | B2 * | 3/2012 | Mizuno | H01L 51/5259 313/512 |
| 8,283,858 | B2 * | 10/2012 | Yonehara | H01J 1/62 313/501 |
| 8,368,129 | B2 * | 2/2013 | Ono | H01L 21/56 257/291 |
| 8,841,656 | B2 | 9/2014 | Sugizaki et al. | |
| 8,853,936 | B2 | 10/2014 | Sugizaki et al. | |
| 8,902,383 | B2 | 12/2014 | Sugi et al. | |
| 8,963,414 | B2 | 2/2015 | Sawabe et al. | |
| 9,214,476 | B1 * | 12/2015 | Lin | H01L 27/3276 |
| 9,269,754 | B2 * | 2/2016 | Lee | H01L 27/3246 |
| 9,425,241 | B2 * | 8/2016 | Yamakita | G02B 5/201 |
| 2002/0158835 | A1 | 10/2002 | Kobayashi et al. | |
| 2011/0260953 | A1 | 10/2011 | Lin et al. | |
| 2012/0299033 | A1 | 11/2012 | Goda | |

FOREIGN PATENT DOCUMENTS

| | | |
|---|---|---|
| JP | 2012-234737 A | 11/2012 |
| TW | I257496 B | 7/2006 |
| TW | 201133978 A1 | 10/2011 |
| TW | 201137467 A1 | 11/2011 |

OTHER PUBLICATIONS

International Search Report mailed Dec. 10, 2013 for PCT/JP2013/079610 filed Oct. 31, 2013 with English Translation.
International Written Opinion mailed Dec. 10, 2013 for PCT/JP2013/079610 filed Oct. 31, 2013.
Japanese Office Action issued on Dec. 4, 2013, in the counterpart JP Application 2013-105482 with English Translation.
Japanese Office Action issued on Apr. 2, 2014 in the counterpart JP Application 2013-105482 with English Translation.
Japanese Office Action issued on Feb. 19, 2015, in the counterpart JP Application 2013-105482 with English Translation.

* cited by examiner

| Ws (μm) | 50.0 | 50.0 | 50.0 | 50.0 | 50.0 | 50.0 | 50.0 | 50.0 |
|---|---|---|---|---|---|---|---|---|
| Ps (μm) | 500.0 | 333.3 | 250.0 | 200.0 | 166.7 | 142.9 | 125.0 | 111.1 |
| 1−Ws/Ps | 0.90 | 0.85 | 0.80 | 0.75 | 0.70 | 0.65 | 0.60 | 0.55 |
| L1 (m) | ○: METAL WIRE IS INVISIBLE, ×: WIRING IS VISIBLE | | | | | | | |
| 1.0 | × | ○ | ○ | ○ | ○ | ○ | ○ | ○ |

FIG. 2A

| Ws (μm) | 100.0 | 100.0 | 100.0 | 100.0 | 100.0 | 100.0 | 100.0 | 100.0 |
|---|---|---|---|---|---|---|---|---|
| Ps (μm) | 1000.0 | 666.7 | 500.0 | 400.0 | 333.3 | 285.7 | 250.0 | 222.2 |
| 1−Ws/Ps | 0.90 | 0.85 | 0.80 | 0.75 | 0.70 | 0.65 | 0.60 | 0.55 |
| L1 (m) | ○: METAL WIRE IS INVISIBLE, ×: WIRING IS VISIBLE | | | | | | | |
| 1.0 | × | × | × | ○ | ○ | ○ | ○ | ○ |

FIG. 2B

| Ws (μm) | 150.0 | 150.0 | 150.0 | 150.0 | 150.0 | 150.0 | 150.0 | 150.0 |
|---|---|---|---|---|---|---|---|---|
| Ps (μm) | 1500.0 | 1000.0 | 750.0 | 600.0 | 500.0 | 428.6 | 375.0 | 333.3 |
| 1−Ws/Ps | 0.90 | 0.85 | 0.80 | 0.75 | 0.70 | 0.65 | 0.60 | 0.55 |
| L1 (m) | ○: METAL WIRE IS INVISIBLE, ×: WIRING IS VISIBLE | | | | | | | |
| 1.0 | × | × | × | × | ○ | ○ | ○ | ○ |

FIG. 2C

| Ws (μm) | 200.0 | 200.0 | 200.0 | 200.0 | 200.0 | 200.0 | 200.0 | 200.0 |
|---|---|---|---|---|---|---|---|---|
| Ps (μm) | 2000.0 | 1333.3 | 1000.0 | 800.0 | 666.7 | 571.4 | 500.0 | 444.4 |
| 1−Ws/Ps | 0.90 | 0.85 | 0.80 | 0.75 | 0.70 | 0.65 | 0.60 | 0.55 |
| L1 (m) | ○: METAL WIRE IS INVISIBLE, ×: WIRING IS VISIBLE | | | | | | | |
| 1.0 | × | × | × | × | × | × | ○ | ○ |

FIG. 2D

| Ws (μm) | 50 | 50 | 50 | 50 | 50 | 50 | 50 | 50 |
|---|---|---|---|---|---|---|---|---|
| Ws1.5 (μm) | 75 | 75 | 75 | 75 | 75 | 75 | 75 | 75 |
| Ps (μm) | 500 | 333.3333 | 250 | 200 | 166.6667 | 142.8571 | 125 | 111.1111 |
| 1−Ws/Ps | 0.9 | 0.85 | 0.8 | 0.75 | 0.7 | 0.65 | 0.6 | 0.55 |
| examinee A | × | ○ | ○ | ○ | ○ | ○ | ○ | ○ |
| examinee B | × | ○ | ○ | ○ | ○ | ○ | ○ | ○ |
| examinee C | × | ○ | ○ | ○ | ○ | ○ | ○ | ○ |
| Average | × | ○ | ○ | ○ | ○ | ○ | ○ | ○ |

FIG. 4A

| Ws (μm) | 100 | 100 | 100 | 100 | 100 | 100 | 100 | 100 |
|---|---|---|---|---|---|---|---|---|
| Ws1.5 (μm) | 150 | 150 | 150 | 150 | 150 | 150 | 150 | 150 |
| Ps (μm) | 1000 | 666.6667 | 500 | 400 | 333.3333 | 285.7143 | 250 | 222.2222 |
| 1−Ws/Ps | 0.9 | 0.85 | 0.8 | 0.75 | 0.7 | 0.65 | 0.6 | 0.55 |
| examinee A | × | × | × | ○ | ○ | ○ | ○ | ○ |
| examinee B | × | × | × | ○ | ○ | ○ | ○ | ○ |
| examinee C | × | × | × | ○ | ○ | ○ | ○ | ○ |
| Average | × | × | × | ○ | ○ | ○ | ○ | ○ |

FIG. 4B

| Ws (μm) | 150 | 150 | 150 | 150 | 150 | 150 | 150 | 150 |
|---|---|---|---|---|---|---|---|---|
| Ws1.5 (μm) | 225 | 225 | 225 | 225 | 225 | 225 | 225 | 225 |
| Ps (μm) | 1500 | 1000 | 750 | 600 | 500 | 428.5714 | 375 | 333.3333 |
| 1−Ws/Ps | 0.9 | 0.85 | 0.8 | 0.75 | 0.7 | 0.65 | 0.6 | 0.55 |
| examinee A | × | × | × | × | ○ | ○ | ○ | ○ |
| examinee B | × | × | × | ○ | ○ | ○ | ○ | ○ |
| examinee C | × | × | × | × | ○ | ○ | ○ | ○ |
| Average | × | × | × | × | ○ | ○ | ○ | ○ |

FIG. 4C

| Ws (μm) | 200 | 200 | 200 | 200 | 200 | 200 | 200 | 200 |
|---|---|---|---|---|---|---|---|---|
| Ws1.5 (μm) | 300 | 300 | 300 | 300 | 300 | 300 | 300 | 300 |
| Ps (μm) | 2000 | 1333.333 | 1000 | 800 | 666.6667 | 571.4286 | 500 | 444.4444 |
| 1−Ws/Ps | 0.9 | 0.85 | 0.8 | 0.75 | 0.7 | 0.65 | 0.6 | 0.55 |
| examinee A | × | × | × | × | × | × | ○ | ○ |
| examinee B | × | × | × | × | × | ○ | ○ | ○ |
| examinee C | × | × | × | × | × | × | ○ | ○ |
| Average | × | × | × | × | × | × | ○ | ○ |

FIG. 4D

| Ws (μm) | 50.0 | 50.0 | 50.0 | 50.0 | 50.0 | 50.0 | 50.0 | 50.0 |
|---|---|---|---|---|---|---|---|---|
| Ps (μm) | 500.0 | 333.3 | 250.0 | 200.0 | 166.7 | 142.9 | 125.0 | 111.1 |
| 1−Ws/Ps | 0.90 | 0.85 | 0.80 | 0.75 | 0.70 | 0.65 | 0.60 | 0.55 |
| L2 (m) | ◎:BLUR IS NOT RECOGNIZED, ○:ACCEPTABLE, ×:UNACCEPTABLE | | | | | | | |
| 0.6 | ◎ | ◎ | ◎ | ○ | ○ | × | × | × |
| 1.2 | ◎ | ◎ | ◎ | ○ | × | × | × | × |
| 10 | ◎ | ◎ | ◎ | ○ | ○ | × | × | × |

FIG. 6A

| Ws (μm) | 100.0 | 100.0 | 100.0 | 100.0 | 100.0 | 100.0 | 100.0 | 100.0 |
|---|---|---|---|---|---|---|---|---|
| Ps (μm) | 1000.0 | 666.7 | 500.0 | 400.0 | 333.3 | 285.7 | 250.0 | 222.2 |
| 1−Ws/Ps | 0.90 | 0.85 | 0.80 | 0.75 | 0.70 | 0.65 | 0.60 | 0.55 |
| L2 (m) | ◎:BLUR IS NOT RECOGNIZED, ○:ACCEPTABLE, ×:UNACCEPTABLE | | | | | | | |
| 0.6 | ◎ | ◎ | ◎ | ◎ | ◎ | ○ | ○ | × |
| 1.2 | ◎ | ◎ | ◎ | ◎ | ◎ | ○ | × | × |
| 10 | ◎ | ◎ | ◎ | ◎ | ○ | ○ | × | × |

FIG. 6B

| Ws (μm) | 150.0 | 150.0 | 150.0 | 150.0 | 150.0 | 150.0 | 150.0 | 150.0 |
|---|---|---|---|---|---|---|---|---|
| Ps (μm) | 1500.0 | 1000.0 | 750.0 | 600.0 | 500.0 | 428.6 | 375.0 | 333.3 |
| 1−Ws/Ps | 0.90 | 0.85 | 0.80 | 0.75 | 0.70 | 0.65 | 0.60 | 0.55 |
| L2 (m) | ◎:BLUR IS NOT RECOGNIZED, ○:ACCEPTABLE, ×:UNACCEPTABLE | | | | | | | |
| 0.6 | ◎ | ◎ | ◎ | ◎ | ◎ | ◎ | ○ | ○ |
| 1.2 | ◎ | ◎ | ◎ | ◎ | ◎ | ◎ | ○ | × |
| 10 | ◎ | ◎ | ◎ | ◎ | ◎ | ◎ | ○ | ○ |

FIG. 6C

| Ws (μm) | 200.0 | 200.0 | 200.0 | 200.0 | 200.0 | 200.0 | 200.0 | 200.0 |
|---|---|---|---|---|---|---|---|---|
| Ps (μm) | 2000.0 | 1333.3 | 1000.0 | 800.0 | 666.7 | 571.4 | 500.0 | 444.4 |
| 1−Ws/Ps | 0.90 | 0.85 | 0.80 | 0.75 | 0.70 | 0.65 | 0.60 | 0.55 |
| L2 (m) | ◎:BLUR IS NOT RECOGNIZED, ○:ACCEPTABLE, ×:UNACCEPTABLE | | | | | | | |
| 0.6 | ◎ | ◎ | ◎ | ◎ | ◎ | ◎ | ◎ | ◎ |
| 1.2 | ◎ | ◎ | ◎ | ◎ | ◎ | ◎ | ◎ | ○ |
| 10 | ◎ | ◎ | ◎ | ◎ | ◎ | ◎ | ◎ | ○ |

| Ws(μm) | 50 | 50 | 50 | 50 | 50 | 50 | 50 | 50 |
|---|---|---|---|---|---|---|---|---|
| Ps(μm) | 500 | 333.3333 | 250 | 200 | 166.6667 | 142.8571 | 125 | 111.1111 |
| 1-Ws/PS | 0.90 | 0.85 | 0.80 | 0.75 | 0.70 | 0.65 | 0.60 | 0.55 |
| examinee D | ◎ | ◎ | ◎ | ◎ | ○ | × | × | × |
| examinee E | ◎ | ◎ | ◎ | ○ | ○ | ○ | × | × |
| examinee F | ◎ | ◎ | ◎ | ◎ | ○ | × | × | × |
| Average | ◎ | ◎ | ◎ | ○ | ○ | ○ | × | × |

FIG. 9A

| Ws(μm) | 100 | 100 | 100 | 100 | 100 | 100 | 100 | 100 |
|---|---|---|---|---|---|---|---|---|
| Ps(μm) | 1000 | 666.6667 | 500 | 400 | 333.3333 | 285.7143 | 250 | 222.2222 |
| 1-Ws/PS | 0.90 | 0.85 | 0.80 | 0.75 | 0.70 | 0.65 | 0.60 | 0.55 |
| examinee D | ◎ | ◎ | ◎ | ○ | ○ | × | × | × |
| examinee E | ◎ | ◎ | ◎ | ◎ | ◎ | ○ | × | × |
| examinee F | ◎ | ◎ | ◎ | ◎ | ◎ | ◎ | ○ | × |
| Average | ◎ | ◎ | ◎ | ○ | ○ | ○ | ○ | × |

FIG. 9B

| Ws(μm) | 150 | 150 | 150 | 150 | 150 | 150 | 150 | 150 |
|---|---|---|---|---|---|---|---|---|
| Ps(μm) | 1500 | 1000 | 750 | 600 | 500 | 428.5714 | 375 | 333.3333 |
| 1-Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ◎ |
| Average | ◎ | ◎ | ◎ | ◎ | ◎ | ◎ | ◎ | ○ |

FIG. 9C

| Ws(μm) | 200 | 200 | 200 | 200 | 200 | 200 | 200 | 200 |
|---|---|---|---|---|---|---|---|---|
| Ps(μm) | 2000 | 1333.333 | 1000 | 800 | 666.6667 | 571.4286 | 500 | 444.4444 |
| 1-Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ◎ |
| Average | ◎ | ◎ | ◎ | ◎ | ◎ | ◎ | ◎ | ○ |

| Ws(μm) | 50 | 50 | 50 | 50 | 50 | 50 | 50 | 50 |
|---|---|---|---|---|---|---|---|---|
| Ps(μm) | 500 | 333.3333 | 250 | 200 | 166.6667 | 142.8571 | 125 | 111.1111 |
| 1−Ws/PS | 0.90 | 0.85 | 0.80 | 0.75 | 0.70 | 0.65 | 0.60 | 0.55 |
| examinee D | ◎ | ◎ | ◎ | ○ | × | × | × | × |
| examinee E | ◎ | ◎ | ◎ | ◎ | ○ | × | × | × |
| examinee F | ◎ | ◎ | ◎ | ◎ | ○ | × | × | × |
| Average | ◎ | ◎ | ◎ | ○ | ○ | × | × | × |

FIG. 10A

| Ws(μm) | 100 | 100 | 100 | 100 | 100 | 100 | 100 | 100 |
|---|---|---|---|---|---|---|---|---|
| Ps(μm) | 1000 | 666.6667 | 500 | 400 | 333.3333 | 285.7143 | 250 | 222.2222 |
| 1−Ws/PS | 0.90 | 0.85 | 0.80 | 0.75 | 0.70 | 0.65 | 0.60 | 0.55 |
| examinee D | ◎ | ◎ | ◎ | ○ | ○ | × | × | × |
| examinee E | ◎ | ◎ | ◎ | ◎ | ◎ | ◎ | ○ | × |
| examinee F | ◎ | ◎ | ◎ | ◎ | ◎ | ○ | × | × |
| Average | ◎ | ◎ | ◎ | ○ | ○ | ○ | ○ | × |

FIG. 10B

| Ws(μm) | 150 | 150 | 150 | 150 | 150 | 150 | 150 | 150 |
|---|---|---|---|---|---|---|---|---|
| Ps(μm) | 1500 | 1000 | 750 | 600 | 500 | 428.5714 | 375 | 333.3333 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ○ | × |
| examinee E | ◎ | ◎ | ◎ | ◎ | ◎ | ◎ | ○ | × |
| examinee F | ◎ | ◎ | ◎ | ◎ | ◎ | ◎ | ○ | × |
| Average | ◎ | ◎ | ◎ | ◎ | ◎ | ◎ | ○ | × |

FIG. 10C

| Ws(μm) | 200 | 200 | 200 | 200 | 200 | 200 | 200 | 200 |
|---|---|---|---|---|---|---|---|---|
| Ps(μm) | 2000 | 1333.333 | 1000 | 800 | 666.6667 | 571.4286 | 500 | 444.4444 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ◎ |
| Average | ◎ | ◎ | ◎ | ◎ | ◎ | ◎ | ◎ | ○ |

| Ws(μm) | 50 | 50 | 50 | 50 | 50 | 50 | 50 | 50 |
|---|---|---|---|---|---|---|---|---|
| Ps(μm) | 500 | 333.3333 | 250 | 200 | 166.6667 | 142.8571 | 125 | 111.1111 |
| 1-Ws/PS | 0.90 | 0.85 | 0.80 | 0.75 | 0.70 | 0.65 | 0.60 | 0.55 |
| examinee D | ◎ | ◎ | ◎ | ○ | × | × | × | × |
| examinee E | ◎ | ◎ | ◎ | ◎ | ○ | × | × | × |
| examinee F | ◎ | ◎ | ◎ | ○ | ○ | × | × | × |
| Average | ◎ | ◎ | ◎ | ○ | ○ | × | × | × |

FIG. 11A

| Ws(μm) | 100 | 100 | 100 | 100 | 100 | 100 | 100 | 100 |
|---|---|---|---|---|---|---|---|---|
| Ps(μm) | 1000 | 666.6667 | 500 | 400 | 333.3333 | 285.7143 | 250 | 222.2222 |
| 1-Ws/PS | 0.90 | 0.85 | 0.80 | 0.75 | 0.70 | 0.65 | 0.60 | 0.55 |
| examinee D | ◎ | ◎ | ◎ | ◎ | ◎ | ○ | × | × |
| examinee E | ◎ | ◎ | ◎ | ◎ | ◎ | ○ | × | × |
| examinee F | ◎ | ◎ | ◎ | ◎ | ◎ | ○ | × | × |
| Average | ◎ | ◎ | ◎ | ◎ | ◎ | ○ | × | × |

FIG. 11B

| Ws(μm) | 150 | 150 | 150 | 150 | 150 | 150 | 150 | 150 |
|---|---|---|---|---|---|---|---|---|
| Ps(μm) | 1500 | 1000 | 750 | 600 | 500 | 428.5714 | 375 | 333.3333 |
| 1-Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ○ |
| Average | ◎ | ◎ | ◎ | ◎ | ◎ | ◎ | ◎ | ○ |

FIG. 11C

| Ws(μm) | 200 | 200 | 200 | 200 | 200 | 200 | 200 | 200 |
|---|---|---|---|---|---|---|---|---|
| Ps(μm) | 2000 | 1333.333 | 1000 | 800 | 666.6667 | 571.4286 | 500 | 444.4444 |
| 1-Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ○ |
| Average | ◎ | ◎ | ◎ | ◎ | ◎ | ◎ | ◎ | ○ |

| Ws(μm) | 50 | 50 | 50 | 50 | 50 | 50 | 50 | 50 |
|---|---|---|---|---|---|---|---|---|
| Ps(μm) | 500 | 333.3333 | 250 | 200 | 166.6667 | 142.8571 | 125 | 111.1111 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ○ | × | × | × |
| examinee E | ◎ | ◎ | ◎ | ○ | ○ | × | × | × |
| examinee F | ◎ | ◎ | ◎ | ◎ | × | × | × | × |
| Average | ◎ | ◎ | ◎ | ○ | ○ | × | × | × |

FIG. 12A

| Ws(μm) | 100 | 100 | 100 | 100 | 100 | 100 | 100 | 100 |
|---|---|---|---|---|---|---|---|---|
| Ps(μm) | 1000 | 666.6667 | 500 | 400 | 333.3333 | 285.7143 | 250 | 222.2222 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ○ | ○ | × |
| examinee E | ◎ | ◎ | ◎ | ◎ | ○ | ○ | × | × |
| examinee F | ◎ | ◎ | ◎ | ◎ | ○ | ○ | ○ | × |
| Average | ◎ | ◎ | ◎ | ◎ | ○ | ○ | ○ | × |

FIG. 12B

| Ws(μm) | 150 | 150 | 150 | 150 | 150 | 150 | 150 | 150 |
|---|---|---|---|---|---|---|---|---|
| Ps(μm) | 1500 | 1000 | 750 | 600 | 500 | 428.5714 | 375 | 333.3333 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ○ | ○ | × |
| examinee F | ◎ | ◎ | ◎ | ◎ | ◎ | ◎ | ○ | ○ |
| Average | ◎ | ◎ | ◎ | ◎ | ◎ | ○ | ○ | ○ |

FIG. 12C

| Ws(μm) | 200 | 200 | 200 | 200 | 200 | 200 | 200 | 200 |
|---|---|---|---|---|---|---|---|---|
| Ps(μm) | 2000 | 1333.333 | 1000 | 800 | 666.6667 | 571.4286 | 500 | 444.4444 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ○ | ○ |
| examinee E | ◎ | ◎ | ◎ | ◎ | ◎ | ◎ | ○ | × |
| examinee F | ◎ | ◎ | ◎ | ◎ | ◎ | ◎ | ○ | ○ |
| Average | ◎ | ◎ | ◎ | ◎ | ◎ | ◎ | ○ | ○ |

| Ws(μm) | 50 | 50 | 50 | 50 | 50 | 50 | 50 | 50 |
|---|---|---|---|---|---|---|---|---|
| Ps(μm) | 500 | 333.3333 | 250 | 200 | 166.6667 | 142.8571 | 125 | 111.1111 |
| 1−Ws/PS | 0.90 | 0.85 | 0.80 | 0.75 | 0.70 | 0.65 | 0.60 | 0.55 |
| examinee D | ◎ | ◎ | ◎ | ○ | × | × | × | × |
| examinee E | ◎ | ◎ | ◎ | ○ | × | × | × | × |
| examinee F | ◎ | ◎ | ◎ | ◎ | ○ | ○ | × | × |
| Average | ◎ | ◎ | ◎ | ○ | ○ | ○ | × | × |

FIG. 13A

| Ws(μm) | 100 | 100 | 100 | 100 | 100 | 100 | 100 | 100 |
|---|---|---|---|---|---|---|---|---|
| Ps(μm) | 1000 | 666.6667 | 500 | 400 | 333.3333 | 285.7143 | 250 | 222.2222 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ○ | × | × |
| examinee E | ◎ | ◎ | ◎ | ◎ | ○ | ○ | × | × |
| examinee F | ◎ | ◎ | ◎ | ◎ | ◎ | ○ | ○ | × |
| Average | ◎ | ◎ | ◎ | ◎ | ○ | ○ | ○ | × |

FIG. 13B

| Ws(μm) | 150 | 150 | 150 | 150 | 150 | 150 | 150 | 150 |
|---|---|---|---|---|---|---|---|---|
| Ps(μm) | 1500 | 1000 | 750 | 600 | 500 | 428.5714 | 375 | 333.3333 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ○ | × |
| examinee E | ◎ | ◎ | ◎ | ◎ | ◎ | ◎ | ◎ | ○ |
| examinee F | ◎ | ◎ | ◎ | ◎ | ◎ | ◎ | ○ | ○ |
| Average | ◎ | ◎ | ◎ | ◎ | ◎ | ◎ | ○ | ○ |

FIG. 13C

| Ws(μm) | 200 | 200 | 200 | 200 | 200 | 200 | 200 | 200 |
|---|---|---|---|---|---|---|---|---|
| Ps(μm) | 2000 | 1333.333 | 1000 | 800 | 666.6667 | 571.4286 | 500 | 444.4444 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ○ | ○ |
| Average | ◎ | ◎ | ◎ | ◎ | ◎ | ◎ | ○ | ○ |

| Ws(μm) | 50 | 50 | 50 | 50 | 50 | 50 | 50 | 50 |
|---|---|---|---|---|---|---|---|---|
| Ps(μm) | 500 | 333.3333 | 250 | 200 | 166.6667 | 142.8571 | 125 | 111.1111 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ○ | × | × | × |
| examinee E | ◎ | ◎ | ◎ | ◎ | ◎ | ○ | × | × |
| examinee F | ◎ | ◎ | ◎ | ◎ | ○ | × | × | × |
| Average | ◎ | ◎ | ◎ | ◎ | ○ | ○ | × | × |

FIG. 14A

| Ws(μm) | 100 | 100 | 100 | 100 | 100 | 100 | 100 | 100 |
|---|---|---|---|---|---|---|---|---|
| Ps(μm) | 1000 | 666.6667 | 500 | 400 | 333.3333 | 285.7143 | 250 | 222.2222 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ○ | ○ | × | × |
| examinee E | ◎ | ◎ | ◎ | ◎ | ◎ | ◎ | ○ | × |
| examinee F | ◎ | ◎ | ◎ | ○ | ○ | ○ | × | × |
| Average | ◎ | ◎ | ◎ | ○ | ○ | ○ | ○ | × |

FIG. 14B

| Ws(μm) | 150 | 150 | 150 | 150 | 150 | 150 | 150 | 150 |
|---|---|---|---|---|---|---|---|---|
| Ps(μm) | 1500 | 1000 | 750 | 600 | 500 | 428.5714 | 375 | 333.3333 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ○ | ○ | × |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ○ |
| Average | ◎ | ◎ | ◎ | ◎ | ◎ | ○ | ○ | ○ |

FIG. 14C

| Ws(μm) | 200 | 200 | 200 | 200 | 200 | 200 | 200 | 200 |
|---|---|---|---|---|---|---|---|---|
| Ps(μm) | 2000 | 1333.333 | 1000 | 800 | 666.6667 | 571.4286 | 500 | 444.4444 |
| 1−Ws/PS | 0.90 | 0.85 | 0.80 | 0.75 | 0.70 | 0.65 | 0.60 | 0.55 |
| examinee D | ◎ | ◎ | ◎ | ◎ | ◎ | ◎ | ◎ | ○ |
| examinee E | ◎ | ◎ | ◎ | ◎ | ◎ | ◎ | ◎ | ○ |
| examinee F | ◎ | ◎ | ◎ | ◎ | ◎ | ◎ | ◎ | ◎ |
| Average | ◎ | ◎ | ◎ | ◎ | ◎ | ◎ | ◎ | ○ |

FIG. 14D

ORGANIC ELECTROLUMINESCENT DEVICE, ILLUMINATION APPARATUS, AND ILLUMINATION SYSTEM

CROSS-REFERENCE TO RELATED APPLICATIONS

This is a continuation application of International Application PCT/JP2013/079610, filed on Oct. 31, 2013; the entire contents of which are incorporated herein by reference.

FIELD

Embodiments described herein relate generally to an organic electroluminescent device, an illumination apparatus, and an illumination system.

BACKGROUND

There is an organic electroluminescent device that includes a light transmissive first electrode, a second electrode, and an organic light emitting layer provided between the first electrode and the second electrode. There is an illumination apparatus using the organic electroluminescent device as a light source. There is an illumination system that includes a plurality of organic electroluminescent devices and a controller configured to control turning on and off of the plurality of organic electroluminescent devices. The organic electroluminescent device is made to be light transmissive by using a thin-line shaped second electrode in which a plurality of openings are provided, or using a light transmissive second electrode. An improvement in the visibility of a transmission image is desired in such an organic electroluminescent device.

BRIEF DESCRIPTION OF THE DRAWINGS

FIGS. 2A to 2D are tables showing respective examples of test results;
FIGS. 4A to 4D are tables showing respective examples of test results;
FIGS. 6A to 6D are tables showing respective examples of test results;
FIGS. 9A to 9D are tables showing examples of test results;
FIGS. 10A to 10D are tables showing examples of test results;
FIGS. 11A to 11D are tables showing examples of test results;
FIGS. 12A to 12D are tables showing examples of test results;
FIGS. 13A to 13D are tables showing examples of test results;
FIGS. 14A to 14D are tables showing examples of test results.

DETAILED DESCRIPTION

Figure 1A:
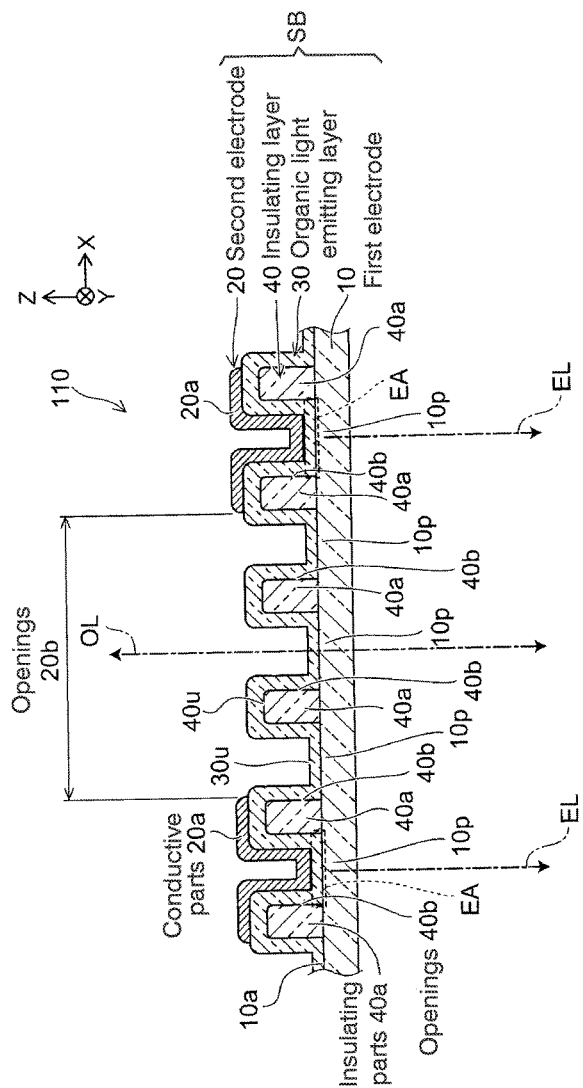
FIGS. 1A and 1B are schematic views showing an organic electroluminescent device according to a first embodiment.

According to one embodiment, an organic electroluminescent device includes a first electrode, an organic light emitting layer, and a second electrode. The first electrode has an upper face. The first electrode is light transmissive. The organic light emitting layer is provided on the first electrode. The second electrode is provided on the organic light emitting layer. The second electrode includes a plurality of conductive parts. The conductive parts extend in a first direction parallel to the upper face and are arranged in a second direction. The second direction is parallel to the upper face and intersects with the first direction. The second electrode is light reflective. When a length of each of the conductive parts in the second direction is set to W1 (micrometer), and a pitch of each of the conductive parts is set to P1 (micrometer). The W1 and the P1 satisfy a relationship of $W1 \leq -647(1-W1/P1)+511$ and a relationship of $W1 \leq -882(1-W1/P1)+847$. $(1-W1/P1)$ is not less than 0.55 and not more than 0.85. The W1 is not less than 75 μm and not more than 300 μm.

According to another embodiment, an organic electroluminescent device includes a first electrode, an organic light emitting layer, a second electrode, and a first wiring layer. The first electrode has an upper face. The first electrode is light transmissive. The organic light emitting layer is provided on the first electrode. The second electrode is provided on the organic light emitting layer. The second electrode is light transmissive. The first wiring layer is provided between the first electrode and the organic light emitting layer and includes a plurality of first wiring parts. The first wiring parts extend in a first direction parallel to the upper face and are arranged in a second direction. The second direction is parallel to the upper face and intersects with the first direction. The first wiring layer is light reflective. When a length of each of the first wiring parts in the second direction is set to Wh1 (micrometer), and a pitch of each of the first wiring parts is set to Ph1 (micrometer). The Wh1 and the Ph1 satisfy a relationship of $Wh1 \geq 647(1-Wh1/Ph1)+511$ and satisfy a relationship of $Wh1 \leq -882(1-Wh1/Ph1)+847$. $(1-Wh1/Ph1)$ is not less than 0.55 and not more than 0.85. The Wh1 is not less than 75 μm and not more than 300 μm.

According to another embodiment, an organic electroluminescent device includes a first electrode, an organic light emitting layer, a second electrode, and a wiring layer. The first electrode has an upper face. The first electrode is light transmissive. The organic light emitting layer is provided on the first electrode. The second electrode is provided on the organic light emitting layer. The second electrode is light transmissive. The wiring layer is provided on the second electrode and includes a plurality of wiring parts. The wiring parts extend in a first direction parallel to the upper face and are arranged in a second direction. The second direction is parallel to the upper face and intersects with the first direction. The wiring layer is light reflective. When a length of each of the wiring parts in the second direction is set to Wh (micrometer), and a pitch of each of the wiring parts is set to Ph (micrometer). The Wh and the Ph satisfy a relationship of $Wh \geq -647(1-Wh/Ph)+511$ and satisfy a relationship of $Wh \leq -882(1-Wh/Ph)+847$. $(1-Wh/Ph)$ is not less than 0.55 and not more than 0.85. The Wh is not less than 75 μm and not more than 300 μm.

According to another embodiment, an illumination apparatus includes an organic electroluminescent device and a power source. The organic electroluminescent device includes a first electrode, an organic light emitting layer, and a second electrode. The first electrode has an upper face. The first electrode is light transmissive. The organic light emitting layer is provided on the first electrode. The second electrode is provided on the organic light emitting layer and includes a plurality of conductive parts. The conductive parts extend in a first direction and are arranged in a second direction. The second direction is parallel to the upper face and intersects with the first direction. The second electrode is light reflective. The power source is electrically connected to the first electrode and the second electrode and supplies a current to the organic light emitting layer via the first electrode and the second electrode. When a length of each of the conductive parts in the second direction is set to W1 (micrometer), and a pitch of each of the conductive parts is set to P1 (micrometer). The W1 and the P1 satisfy a relationship of $W1 \geq -647(1-W1/P1)+511$ and a relationship of $W1 \leq -882(1-W1/P1)+847$. $(1-W1/P1)$ is not less than 0.55 and not more than 0.85. The W1 is not less than 75 μm and not more than 300 μm.

According to another embodiment, an illumination apparatus includes an organic electroluminescent device and a power source. The organic electroluminescent device includes a first electrode, an organic light emitting layer, a second electrode, and a first wiring layer. The first electrode has an upper face. The first electrode is light transmissive. The organic light emitting layer is provided on the first electrode. The second electrode is provided on the organic light emitting layer. The second electrode is light transmissive. The first wiring layer is provided between the first electrode and the organic light emitting layer and includes a plurality of first wiring parts. The first wiring parts extend in a first direction and are arranged in a second direction. The second direction is parallel to the upper face and intersects with the first direction. The first wiring layer is light reflective. The power source is electrically connected to the first electrode and the second electrode and supplies a current to the organic light emitting layer via the first electrode and the second electrode. When a length of each of the first wiring parts in the second direction is set to Wh1 (micrometer), and a pitch of each of the first wiring parts is set to Ph1 (micrometer). The Wh1 and the Ph1 satisfy a relationship of $Wh1 \geq -647(1-Wh1/Ph1)+511$ and a relationship of $Wh1 \leq -882(1-Wh1/Ph1)+847$. $(1-Wh1/Ph1)$ is not less than 0.55 and not more than 0.85. The Wh1 is not less than 75 μm and not more than 300 μm.

According to another embodiment, an illumination apparatus includes an organic electroluminescent device and a power source. The organic electroluminescent device includes a first electrode, an organic light emitting layer, a second electrode, and a wiring layer. The first electrode has an upper face. The first electrode is light transmissive. The organic light emitting layer is provided on the first electrode. The second electrode is provided on the organic light emitting layer. The second electrode is light transmissive. The wiring layer is provided on the second electrode and includes a plurality of wiring parts. The wiring parts extend in a first direction and are arranged in a second direction. The second direction is parallel to the upper face and intersects with the first direction. The wiring layer is light reflective. The power source is electrically connected to the first electrode and the second electrode and supplies a current to the organic light emitting layer via the first electrode and the second electrode. When a length of each of the wiring parts in the second direction is set to Wh (micrometer), and a pitch of each of the wiring parts is set to Ph (micrometer). The Wh and the Ph satisfy a relationship of $Wh \geq -647(1-Wh/Ph)+511$ and a relationship of $Wh \leq -882(1-Wh/Ph)+847$. $(1-Wh/Ph)$ is not less than 0.55 and not more than 0.85. The Wh is not less than 75 μm and not more than 300 μm.

According to another embodiment, an illumination system includes a plurality of organic electroluminescent devices and a controller. Each of the organic electroluminescent devices includes a first electrode, an organic light emitting layer, and a second electrode. The first electrode has an upper face. The first electrode is light transmissive. The organic light emitting layer is provided on the first electrode. The second electrode is provided on the organic light emitting layer and includes a plurality of conductive parts. The conductive parts extend in a first direction parallel to the upper face and are arranged in a second direction. The second direction is parallel to the upper face and intersects with the first direction. The second electrode is light reflective. The controller is electrically connected to each of the organic electroluminescent devices and controls turning on and off of each of the organic electroluminescent devices. When a length of each of the conductive parts in the second direction is set to W1 (micrometer), and a pitch of each of the conductive parts is set to P1 (micrometer). The W1 and the P1 satisfy a relationship of $W1 \geq -647(1-W1/P1)+511$ and a relationship of $W1 \leq -882(1-W1/P1)+847$. $(1-W1/P1)$ is not less than 0.55 and not more than 0.85. The W1 is not less than 75 μm and not more than 300 μm.

According to another embodiment, an illumination system includes a plurality of organic electroluminescent devices and a controller. Each of the organic electroluminescent devices includes a first electrode, an organic light emitting layer, a second electrode, and a first wiring layer. The first electrode has an upper face. The first electrode is light transmissive. The organic light emitting layer is provided on the first electrode. The second electrode is provided on the organic light emitting layer. The second electrode is light transmissive. The first wiring layer is provided between the first electrode and the organic light emitting layer and includes a plurality of first wiring parts. The first wiring parts extend in a first direction parallel to the upper face and are arranged in a second direction. The second direction is parallel to the upper face and intersects with the first direction. The first wiring layer is light reflective. The controller is electrically connected to each of the organic electroluminescent devices and controls turning on and off of each of the organic electroluminescent devices. When a length of each of the first wiring parts in the second direction is set to Wh1 (micrometer), and a pitch of each of the first wiring parts is set to Ph1 (micrometer). The Wh1 and the Ph1 satisfy a relationship of Wh1≥−647(1−Wh1/Ph1)+511 and a relationship of Wh1≤−882(1−Wh1/Ph1)+847. (1−Wh1/Ph1) is not less than 0.55 and not more than 0.85. The Wh1 is not less than 75 μm and not more than 300 μm.

According to another embodiment, an illumination system includes a plurality of organic electroluminescent devices and a controller. Each of the organic electroluminescent devices includes a first electrode, an organic light emitting layer, a second electrode, and a wiring layer. The first electrode has an upper face. The first electrode is light transmissive. The organic light emitting layer is provided on the first electrode. The second electrode is provided on the organic light emitting layer. The second electrode is light transmissive. The wiring layer is provided on the second electrode and includes a plurality of wiring parts. The wiring parts extend in a first direction parallel to the upper face and are arranged in a second direction. The second direction is parallel to the upper face and intersects with the first direction. The wiring layer is light reflective. The controller is electrically connected to each of the organic electroluminescent devices and controls turning on and off of each of the organic electroluminescent devices. When a length of each of the wiring parts in the second direction is set to Wh (micrometer), and a pitch of each of the wiring parts is set to Ph (micrometer). The Wh and the Ph satisfy a relationship of Wh≥−647(1−Wh/Ph)+511 and a relationship of Wh≤−882(1−Wh/Ph)+847. (1−Wh/Ph) is not less than 0.55 and not more than 0.85. The Wh is not less than 75 μm and not more than 300 μm.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Also, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
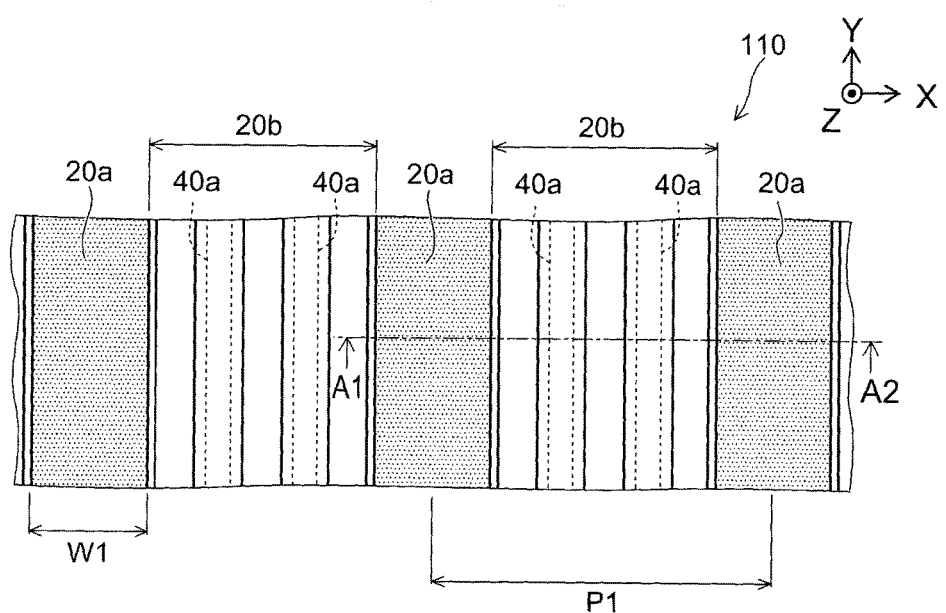

FIGS. 1A and 1B are schematic views showing an organic electroluminescent device according to a first embodiment.

FIG. 1A is a schematic cross-sectional view, and FIG. 1B is a schematic plan view.

FIG. 1A is a cross-sectional view along an A1-A2 line in FIG. 1B. These drawings expand and illustrate a part of the organic electroluminescent device according to the embodiment.

As shown in FIGS. 1A and 1B, an organic electroluminescent device 110 includes a stacked body SB. The stacked body SB includes a first electrode 10, a second electrode 20, and an organic light emitting layer 30. In the example, the stacked body SB furthermore includes an insulating layer 40. The insulating layer 40 is provided as appropriate and can be omitted.

The first electrode 10 has an upper face 10a. The first electrode 10 has light permeability. The first electrode 10 is, for example, a transparent electrode.

Here, the direction perpendicular to the upper face 10a is defined as a Z-axis direction. One direction parallel to the upper face 10a is defined as an X-axis direction. The direction perpendicular to the X-axis direction and the Z-axis direction is defined as a Y-axis direction. The X-axis direction and the Y-axis direction are directions perpendicular to the Z-axis direction. The Z-axis direction corresponds to the thickness direction of the first electrode 10.

The insulating layer 40 is light transmissive. The insulating layer 40 is, for example, transparent. The insulating layer 40 is provided on the upper face 10a of the first electrode 10. The insulating layer 40 has an insulating part 40a and an opening 40b. The insulating layer 40 has, for example, a plurality of insulating parts 40a and a plurality of openings 40b. Each of the plurality of insulating parts 40a extends in a first direction parallel to the upper face 10a, and is arranged side by side in a second direction that is parallel to the upper face 10a and crosses over the first direction. In the example, each of the plurality of insulating parts 40a is arranged side by side in the X-axis direction and extends in the Y-axis direction. That is, in the example, the first direction is the Y-axis direction, and the second direction is the X-axis direction. In the example, the second direction is perpendicular to the first direction. The second direction may be an arbitrary direction intersecting with the first direction.

Each of the plurality of openings 40b is provided between each of the plurality of insulating parts 40a. In the example, each of the plurality of openings 40b extends in the Y-axis direction and is arranged side by side in the X-axis direction. That is, in the example, each of the plurality of openings 40b is in a trench-like shape. Each of the plurality of openings 40b allows a part of the first electrode 10 to be exposed. In the example, by each of the plurality of openings 40b, a plurality of parts of the first electrode 10 are exposed. Hereinafter, a part exposed by the opening 40b in the first electrode 10 will be referred to as an exposed part 10p.

The organic light emitting layer 30 is provided on the upper face 10a of the first electrode 10. In the example, the organic light emitting layer 30 is provided on the insulating layer 40. In other words, the insulating layer 40 is provided between the first electrode 10 and the organic light emitting layer 30. The organic light emitting layer 30 is provided, for example, on the whole of the insulating layer 40. In the example, the organic light emitting layer 30 includes parts extending on each of the plurality of exposed parts 10p of the first electrode 10 and parts extending on each of the plurality of insulating parts 40a of the insulating layer 40. The organic light emitting layer 30 has, for example, light permeability. The organic light emitting layer 30 is, for example, transparent.

The thickness of the organic light emitting layer 30 (the length along the Z-axis direction) is smaller than the thickness of the insulating layer 40 (the insulating part 40a). The distance between an upper face 30u of a part extending on the exposed part 10p of the organic light emitting layer 30 and the upper face 10a of the first electrode 10 in the Z-axis direction is shorter than the distance between the upper face 40u of the insulating part 40a of the insulating layer 40 and the upper face 10a of the first electrode 10 in the Z-axis direction. That is, the upper face 30u is positioned below the upper face 40u.

The second electrode 20 is provided on the organic light emitting layer 30. The second electrode 20 has a plurality of conductive parts 20a and a plurality of openings 20b. Each of the plurality of conductive parts 20a extends in the first direction and is arranged side by side in the second direction. In the example, each of the plurality of conductive parts 20a extends in the Y-axis direction and is arranged side by side in the X-axis direction. Each of the plurality of conductive parts 20a is disposed in a position that overlaps with any of the plurality of exposed parts 10p, when being projected onto a plane parallel to the upper face 10a (an X-Y plane). In the example, each of spaces between the plurality of conductive parts 20a is different from each of spaces between the plurality of insulating parts 40a. The space in the X-axis direction of each of the plurality of conductive parts 20a is wider than the space in the X-axis direction of each of the plurality of insulating parts 40a. In the example, when being projected onto the X-Y plane, in each of spaces between the plurality of conductive parts 20a, three openings 40b are disposed. When projected onto the X-Y plane, the number of openings 40b to be disposed between each of the plurality of conductive parts 20a is arbitrary. Between each of the plurality of conductive parts 20a, no opening 40b may be disposed. That is, each of the plurality of conductive parts 20a may overlap with each of the plurality of exposed parts 10p, when being projected onto the X-Y plane.

Each of the plurality of openings 20b is disposed between each of the plurality of conductive parts 20a. In the example, each of the plurality of openings 20b is in a trench-like shape extending in the Y-axis direction. Each of the plurality of openings 20b extends in the Y-axis direction and is arranged side by side in the X-axis direction. In the example, the second electrode 20 and the insulating layer 40 are in a stripe-like shape.

The second electrode 20 (the conductive part 20a) has, for example, light reflectivity. The light reflectance of the second electrode 20 is higher than the light reflectance of the first electrode 10. In the specification of the application, a state of having light reflectance higher than the light reflectance of the first electrode 10 is referred to as having light reflectivity.

The organic light emitting layer 30 is electrically connected to the first electrode 10 via each of the plurality of openings 40b. The organic light emitting layer 30 makes contact with each of the plurality of exposed parts 10p of the first electrode 10, for example, via each of the plurality of openings 40b. Consequently, the organic light emitting layer 30 is electrically connected to the first electrode 10.

The organic light emitting layer 30 is electrically connected to the second electrode 20. The organic light emitting layer 30 makes contact with, for example, each of the plurality of conductive parts 20a. Consequently, the organic light emitting layer 30 is electrically connected to the second electrode 20. In the specification of the application, "connected electrically" includes, in addition to the case where they are directly in connection with each other, the case where another conductive member or the like is inserted between these.

A current is flown to the organic light emitting layer 30 using the first electrode 10 and the second electrode 20. Consequently, the organic light emitting layer 30 emits light. For example, when a current is flown, the organic light emitting layer 30 recombine an electron and a hole to thereby generate an exciton. The organic light emitting layer 30 emits light by utilizing the discharge of light, for example, when the exciton is radiatively deactivated.

In the organic electroluminescent device 110, a part between the exposed part 10p and conductive part 20a in the organic light emitting layer 30 serves as an emission region EA. In the example, the organic light emitting layer 30 has the plurality of emission regions EA between each of the plurality of exposed parts 10p and each of the plurality of conductive parts 20a. The insulating layer 40 functions as a contact preventing layer, for example, that suppresses the contact between a mask for patterning (for example, a metal mask) and a part serving as the emission region EA of the organic light emitting layer 30 when forming the second electrode 20. By providing the insulating layer 40, for example, the yield of the organic electroluminescent device 110 can be enhanced.

Emission EL emitted from the emission region EA goes to the outside of the organic electroluminescent device 110 via the first electrode 10. A part of the emission EL is reflected by the second electrode 20, and goes to the outside via the organic light emitting layer 30 and the first electrode 10. That is, the organic electroluminescent device 110 is of a single-sided light emission type.

Furthermore, in the organic electroluminescent device 110, outside light OL entering the device from the outside passes through the first electrode 10, the organic light emitting layer 30 and the insulating layer 40, in parts positioned between each of the plurality of conductive parts 20a. As described above, the organic electroluminescent device 110 allows the outside light OL entering the organic electroluminescent device 110 from the outside to pass through while causing the emission EL to go outside. As described above, the organic electroluminescent device 110 has light permeability. Consequently, in the organic electroluminescent device 110, an image in a background can be visually recognized via the organic electroluminescent device 110. That is, the organic electroluminescent device 110 is a thin film-like or plate-like light source capable of being seen through.

In this way, according to the organic electroluminescent device 110 of the embodiment, a light transmissive organic electroluminescent device can be provided. When the organic electroluminescent device 110 is applied to illumination apparatuses, various new applications become possible by a function of allowing a background image to be seen through in addition to an illumination function.

The width of the conductive part 20a is set to W1. The pitch of respective conductive parts 20a is set to P1. The width W1 is the length of the conductive part 20a in the X-axis direction. The pitch P1 is, for example, the distance in the X-axis direction between centers of two adjacent conductive parts 20a in the X-axis direction.

In the organic electroluminescent device 110 according to the embodiment, the width W1 and the pitch P1 of respective conductive parts 20a satisfy the relationship of $W1 \geq -647 (1-W1/P1)+511$. Consequently, the visibility of a transmission image can be enhanced.

In the light transmissive organic electroluminescent device, in order to make the second electrode 20 be hardly seen, narrowing of the width of the conductive part 20a is requested. When the width of the conductive part 20a is made narrow, the area of the emission region is reduced. Consequently, for example, when the second electrode 20 is made in a stripe-like pattern shape, the pitch of the plurality of conductive parts 20a is required to be narrowed while making the width of the conductive part 20a narrow, in order to obtain appropriate emission luminance while making the second electrode 20 be hardly seen. However, when the pitch is made narrow, the visibility of a transmission image lowers. For example, the transmission image is obscured. It is considered that the phenomenon is caused, for example, by the diffraction of light.

Therefore, the inventors of the application performed experiments on the relation between the width and pitch of the conductive part 20*a* and the lowering of the visibility of a transmission image.

The inventors of the application first fabricated a plurality of samples while changing the width and pitch of respective conductive parts 20*a* of the second electrode 20, and performed experiments for respective samples whether or not respective conductive parts 20*a* were able to be visually recognized. In samples, a metal thin film was made into a stripe-shaped pattern on a glass substrate (hereinafter, referred to as a metal pattern). Consequently, the shape obtained by projecting the second electrode 20 onto the X-Y plane was formed in a simulated way.

The width of one metal line included in the metal pattern is set to Ws. The width Ws corresponds to the width W1 of the conductive part 20*a*. The pitch of respective metal lines is set to Ps. The pitch Ps corresponds to the pitch P1 of respective conductive parts 20*a*. In the experiment, a plurality of samples having different widths Ws were prepared. Then, a plurality of samples having different pitches Ps were prepared for one width Ws. That is, a plurality of samples having different aperture ratios AR=(1−Ws/Ps) were prepared. Specifically, the width Ws was set to be 50 μm, 100 μm, 150 μm or 200 μm. Then, the aperture ratio AR was set to be 0.55, 0.60, 0.65, 0.70, 0.75, 0.80, 0.85 or 0.90 for each of widths Ws. That is, in the experiment, total thirty two kinds, that is, four kinds for the width Ws and eight kinds for the aperture ratio AR of samples were prepared.

In the experiment, each of samples was evaluated while setting a distance L1 between the sample and an examinee to be 1 m, which is assumed to be the shortest distance when considering the usage state of the organic electroluminescent device 110 according to the embodiment. That is, the illumination apparatus is used generally while being provided at a positon separated from the sample in not less than 1 m. In the experiment, the examinee is one person. The examinee has eyesight of 1.5. The examinee was approximately confronted by the plane in which the metal pattern of the sample was provided. In the experiment, the background was set to be uniformly white.

FIGS. 2A to 2D are tables showing respective examples of test results.

FIG. 2A shows evaluation results of respective samples in which the width Ws of the metal line was set to be 50 μm. FIG. 2B shows evaluation results of respective samples in which the width Ws of the metal line was set to be 100 μm. FIG. 2C shows evaluation results of respective samples in which the width Ws of the metal line was set to be 150 μm. FIG. 2D shows evaluation results of respective samples in which the width Ws of the metal line was set to be 200 μm. In FIGS. 2A to 2D, samples for which the metal pattern was invisible is given "o" and samples for which the metal pattern was visible is given "x."

Here, the fact that the metal line (the conductive part 20*a*) is "invisible" includes, for example, a case or the like where a line overlaps with an image of adjacent line to thereby make the line unrecognizable as one line, in addition to a case where the line completely can not be recognized visually by a person. That is, in the specification of the application, "invisible" means a state where the pattern shape of respective metal lines (the conductive part 20*a*) substantially can not be recognized.

Figure 3:
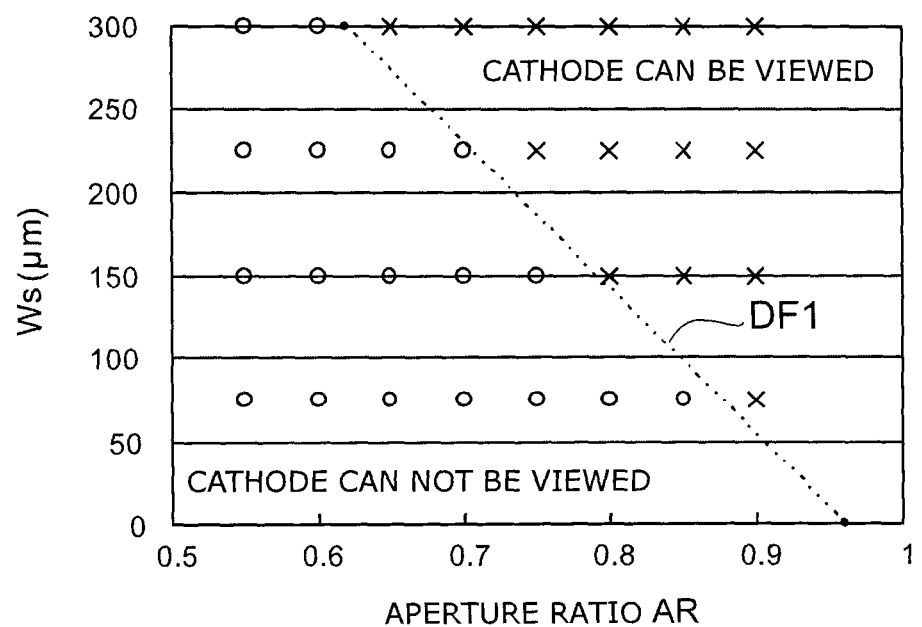
FIG. 3 is a graph showing an example of test results.

FIG. 3 is a graph showing an example of test results.

FIG. 3 is a graph that plots the relationship between the aperture ratio AR and the metal line width Ws obtained from the results shown in FIGS. 2A to 2D. Although the eyesight of the examinee is 1.5, typical eyesight is 1.0. Since the visibility of the line is determined by the visual angle from the eyesight characteristic of a person, in the plot in FIG. 3, while assuming the typical eyesight of 1.0, the metal line width Ws is set to be 1.5 times the value in FIG. 2. The aperture ratio is the ratio of Ws/Ps and is invariable. The eyesight of 1.0 is, in other words, 20/20 (twenty-twenty).

The visibility of the metal line (conductive part 20*a*) is not determined merely by the width Ws of the metal line, or the space of the metal lines (Ps−Ws), but depends on both the width Ws of the metal line and the cathode aperture ratio AR=(1−Ws/Ps), as shown in FIG. 3. From the drawing, it is known that conditions under which the metal line becomes invisible can not be obtained, for example, at the aperture ratio of AR=0.95.

As shown in FIG. 3, the relationship between the aperture ratio AR and the width Ws of the metal line can be shown by a linear function DF1. The linear function DF1 is, specifically, Ws=−882AR+847. In FIG. 3, the region positioned on the left side of the linear function DF1 is a region where the metal line is invisible. The region positioned on the right side of the linear function DF1 is a region where the metal line is visible. That is, the width Ws and the pitch Ps are set to satisfy the relationship of Ws≤−882AR+847. Consequently, the metal line can be made invisible.

In the second electrode 20, the width W1 and the pitch P1 of respective conductive parts 20*a* are set to satisfy the relationship of W1≤−882AR+847. More specifically, they are set to satisfy the relationship of W1≤−882(1−W1/P1)+847. More consequently, at 1 m that is the shortest distance assumed from the usage state of the embodiment, in the second electrode 20, respective conductive parts 20*a* can be made invisible. In respective relational formulae, the unit of each of Ws, Ps, W1 and P1 is micrometer.

The inventors of the application further performed an experiment on whether or not respective conductive parts 20*a* were visible. In the experiment, the number of examinees was three. The eyesight of an examinee A is 1.5 as corrected eyesight. The eyesight of an examinee B is 1.5 as a naked eyesight. The eyesight of an examinee C is 1.5 as a corrected eyesight. Then, the evaluation was performed while setting the distance L1 to be 1.0 m. Other experiment conditions are substantially the same as above.

FIGS. 4A to 4D are tables showing respective examples of test results.

FIG. 4A shows evaluation results of respective samples in which the width Ws of the metal line was set to be 50 μm. FIG. 4B shows evaluation results of respective samples in which the width Ws of the metal line was set to be 100 μm. FIG. 4C shows evaluation results of respective samples in which the width Ws of the metal line was set to be 150 μm. FIG. 4D shows evaluation results of respective samples in which the width Ws of the metal line was set to be 200 μm.

In FIGS. 4A to 4D, Ws of 1.5 is the width of the metal line when the eyesight of respective examinees is converted into 1.0. In addition, in the experiment, the average of evaluations of respective examinees was obtained for each of respective samples. In FIGS. 4A to 4D, the average of a sample determined as "o" by not less than two examinees is defined as "o," and the average of a sample determined as "o" by not more than one examinee is defined as "x."

Figure 5:
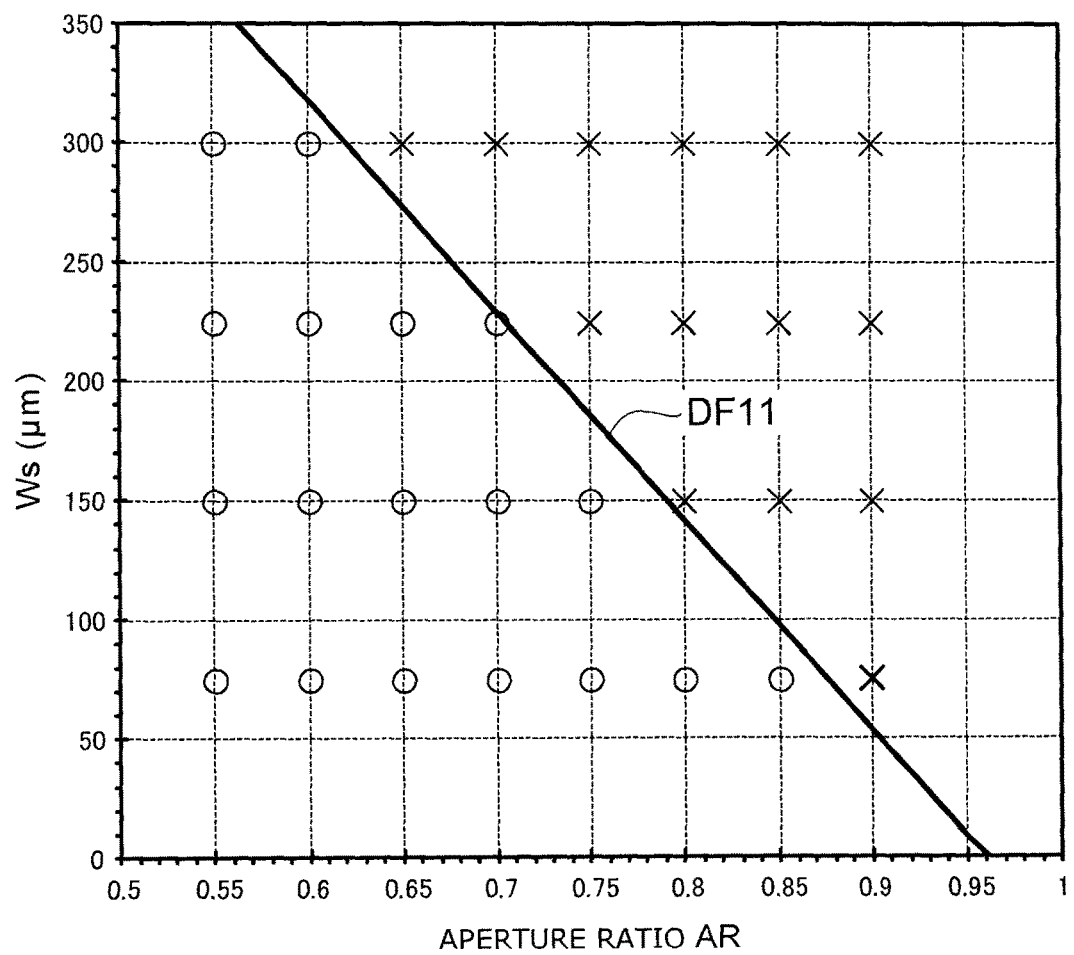
FIG. 5 is a graph showing an example of test results.

FIG. 5 is a graph showing an example of test results.

FIG. 5 is a graph plotting the relationship between the aperture ratio AR and the metal line width Ws obtained from the results in FIGS. 4A to 4D. In FIG. 5, the average of evaluations of respective examinees is shown together. Furthermore, in FIG. 5, as the width Ws of the metal line, the value of Ws of 1.5 in FIGS. 4A to 4D is used as the width Ws of the metal line.

As shown in FIG. 5, the relationship between the aperture ratio AR and the width Ws of the metal line can be represented by a linear function DF11. The linear function DF11 is, specifically, Ws=−882AR+847. That is, the linear function DF11 is substantially the same as the linear function DF1.

In this way, also in the experiment in which the number of examinees were increased to three, substantially the same result as that in the experiment in which the number of examinees was one and the distance L1=1 m was obtained. Accordingly, in the second electrode 20, a configuration is such that the width W1 and the pitch P1 of respective conductive parts 20a satisfy the relationship of W1≤−882AR+847. More specifically, a configuration is such that they satisfy the relationship of W1≤−882(1−W1/P1)+847. Consequently, respective conductive parts 20a can be made invisible. However, in respective relational formulae, the unit of each of Ws, Ps, W1 and P1 is micrometer.

Next, the inventors of the application performed an experiment, using the plurality of samples same as those in the above-mentioned experiment, whether or not a transmission image for respective samples blurs. In the experiment, the sample was disposed between an object to be observed and the examinee. The object to be observed, the sample and the examinee were arranged side by side approximately in a straight line. The examinee was approximately confronted by the face of the sample on which the metal pattern was provided. Letters of "ABC" were used for the object to be observed. The distance L1 between the sample and the examinee was set to be 1 m. In the experiment, a distance L2 between the object to be observed and the sample was changed for respective samples, and evaluations were performed at a plurality of distances L2. Specifically, distance L2 was changed to be 0.6 m, 1.2 m or 10 m and the evaluation was performed. In the experiment, the examinee is one. The eyesight of the examinee is 1.5. The blur of a transmission image has no relationship with the eyesight, and thus in the following, no correction is performed depending on the eyesight, unlike the experiment of the visibility of the metal line.

Furthermore, a plurality of letter strings "ABC" having different font sizes were arranged and provided as the object to be observed. The font size was changed to be 25 Pt (point), 32 Pt, 36 Pt, 40 Pt, 48 Pt, 54 Pt, 60 Pt, 72 Pt, 88 Pt or 700 Pt. In a letter string having an appropriately visible size with the eyesight of the examinee, the degree of the blur of the transmission image did not change substantially depending on the difference in the font size. In the case of a large distance L2 (for example, 10 m), the evaluation was performed based on the letter string of 700 Pt. The "blur of the transmission image" means that, for example, the object to be observed is viewed in a multiple state caused by haze (diffusion of light) or diffraction. A state where the blur of a transmission image is generated means a state, for example, where there is difference in visions when the object to be observed is viewed via the sample (organic electroluminescent device) and when the object to be observed is seen without via the sample.

FIGS. 6A to 6D are tables showing respective examples of test results.

FIG. 6A shows evaluation results of respective samples in which the width Ws of the metal line was set to be 50 μm. FIG. 6B shows evaluation results of respective samples in which the width Ws of the metal line was set to be 100 μm. FIG. 6C shows evaluation results of respective samples in which the width Ws of the metal line was set to be 150 μm. FIG. 6D shows evaluation results of respective samples in which the width Ws of the metal line was set to be 200 μm.

In FIGS. 6A to 6D, samples for which the blur of a transmission image caused a problem (the blur was not recognized) are given "oo (double circle)," samples for which the blur of a transmission image was recognized to the extent of being acceptable are given "o" and samples for which the blur of a transmission image was unacceptable are given "x."

Figure 7A:
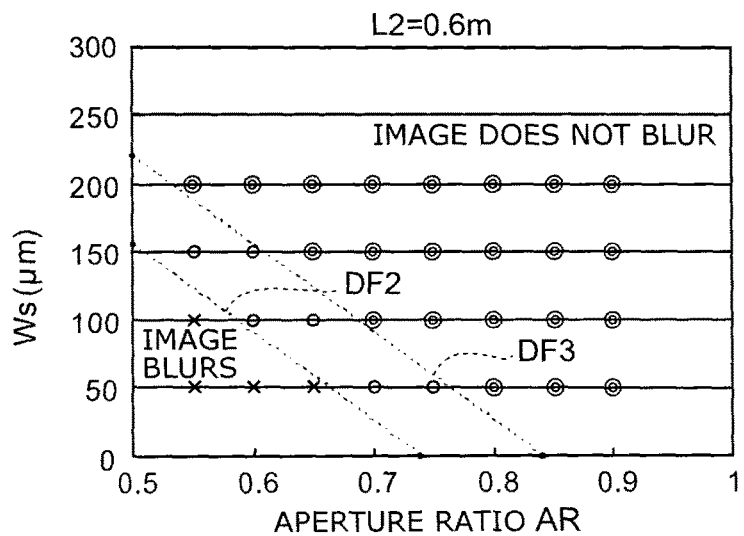
FIGS. 7A to 7C are graphs showing respective examples of test results.
Figure 7B:
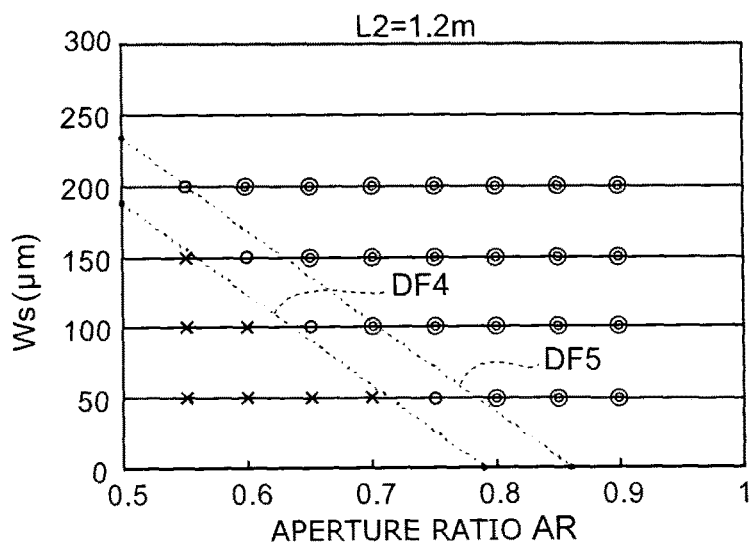
Figure 7C:
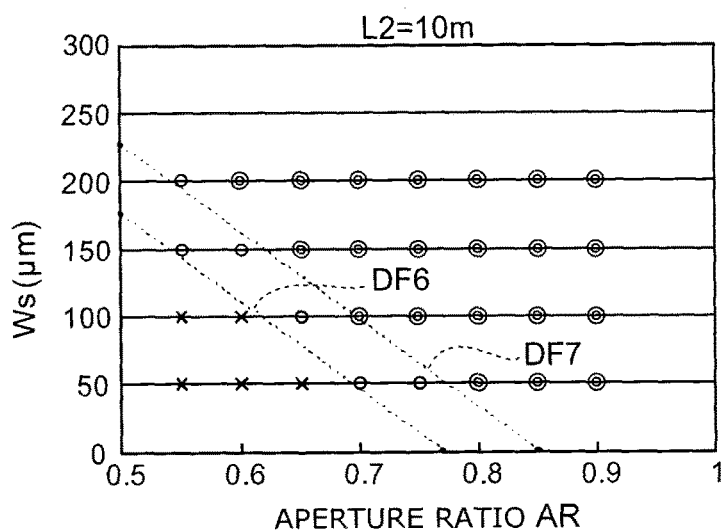

FIGS. 7A to 7C are graphs showing respective examples of test results.

FIG. 7A is a graph in which test results when the distance L2=0.6 m are shown together.

FIG. 7B is a graph in which test results when the distance L2=1.2 m are shown together.

FIG. 7C is a graph in which test results when the distance L2=10 m are shown together.

As shown in FIGS. 7A to 7C, the inventors of the application found by the experiment that the range in which a transmission image blurs can be represented using the relationship between the width Ws of the metal line and the is aperture ratio AR=(1−Ws/Ps).

As shown in FIG. 7A, at distance L2=0.6 m, the threshold value of the blur of a transmission image when an evaluation value "o" is accepted can be represented by a linear function DF2. The linear function DF2 is, specifically, Ws=−647AR+479. In FIG. 7A, the region positioned on the left side of the linear function DF2 is a region in which a transmission image blurs. The region positioned on the right side of the linear function DF2 is a region in which a transmission image does not blur. That is, the width Ws and the pitch Ps are set to satisfy the relationship of Ws≥−647AR+479. Consequently, in the case where distance L2=0.6 m, the blur of a transmission image can be suppressed.

Further, at distance L2=0.6 m, the threshold value of blur of a transmission image when the evaluation value of "o" is not accepted can be represented by a linear function DF3. The linear function DF3 is, specifically, Ws=−647AR+544. That is, the width Ws and the pitch Ps are set to satisfy the relationship of Ws≤−647AR+544. Consequently, in the case of distance L2=0.6 m, the blur of a transmission image can be suppressed more suitably.

As shown in FIG. 7B, at distance L2=1.2 m, the threshold value of the blur of a transmission image when an evaluation value "o" is accepted can be represented by a linear function DF4. The linear function DF4 is, specifically, Ws=−647AR+511. In FIG. 7B, the region positioned on the left side of the linear function DF4 is a region in which a transmission image blurs. The region positioned on the right side of the linear function DF4 is a region in which a transmission image does not blur. That is, the width Ws and the pitch Ps are set to satisfy the relationship of Ws≥−647AR+511. Consequently, in the case where distance L2=1.2 m, the blur of a transmission image can be suppressed.

Further, at distance L2=1.2 m, the threshold value of blur of a transmission image when the evaluation value of "o" is not accepted can be represented by a linear function DF5. The linear function DF5 is, specifically, Ws=−647AR+557. That is, the width Ws and the pitch Ps are set to satisfy the relationship of $Ws \geq -647AR+557$. Consequently, in the case of distance $L2=1.2$ m, the blur of a transmission image can be suppressed more suitably.

As shown in FIG. 7C, at distance $L2=10$ m, the threshold value of the blur of a transmission image when an evaluation value "o" is accepted can be represented by a linear function DF6. The linear function DF6 is, specifically, $Ws=-647AR+498$. In FIG. 7C, the region positioned on the left side of the linear function DF6 is a region in which a transmission image blurs. The region positioned on the right side of the linear function DF6 is a region in which a transmission image does not blur. That is, the width Ws and the pitch Ps are set to satisfy the relationship of $Ws \leq -647AR+498$. Consequently, in the case where distance $L2=10$ m, the blur of a transmission image can be suppressed.

Further, at distance $L2=10$ m, the threshold value of blur of a transmission image when the evaluation value of "o" is not accepted can be represented by a linear function DF7. The linear function DF7 is, specifically, $Ws=-647AR+550$. That is, the width Ws and the pitch Ps are set to satisfy the relationship of $Ws \leq -647AR+550$. Consequently, in the case of distance $L2=10$ m, the blur of a transmission image can be suppressed more suitably.

Figure 8:
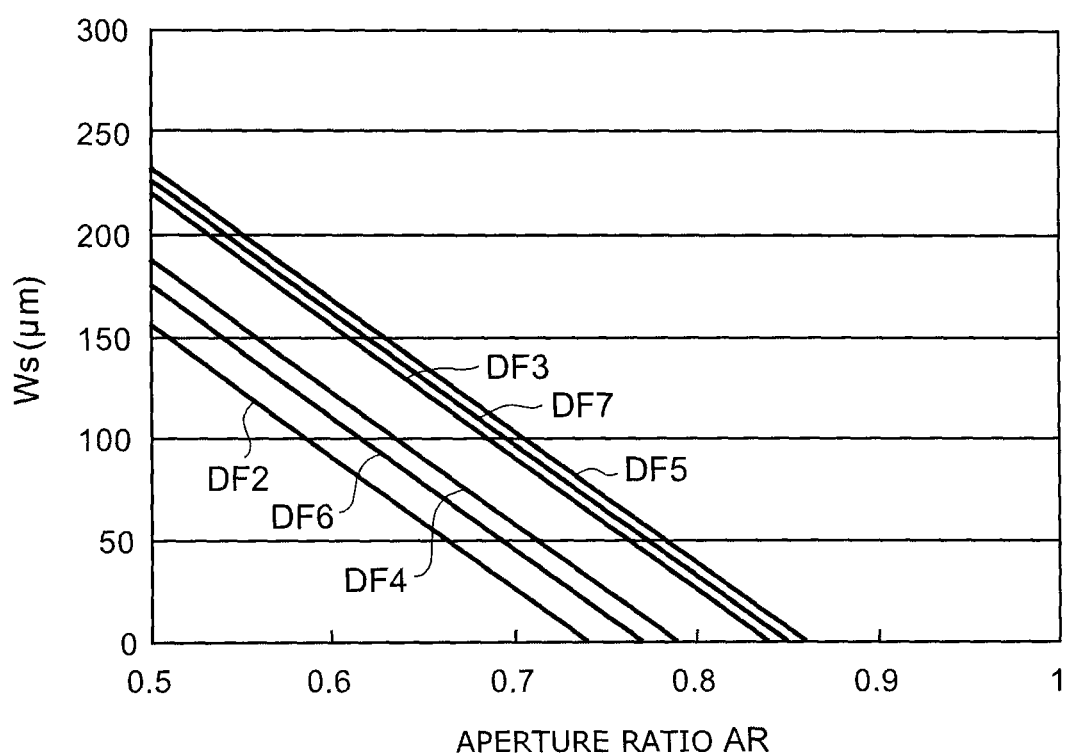
FIG. 8 is a graph showing an example of test results.

FIG. 8 is a graph showing an example of test results.

In FIG. 8, linear functions DF2 to DF7 obtained from FIGS. 7A to 7C are put together.

As shown in FIG. 8, the border line of threshold values whether or not a transmission image blurs can be represented approximately by a linear function in a plane formed by the aperture ratio AR and width Ws of a metal line. For example, a transmission image can be made difficult to blur by setting the aperture ratio AR to be large. Dependency on the distance L2 is comparatively small, and is of such a degree that the border line slightly changes in a larger or smaller direction of the aperture ratio AR.

Among three results of the distance L2, the strictest evaluation result was obtained when the distance $L2=1.2$ m. Therefore, for the second electrode 20, the result when distance $L2=1.2$ m is adopted.

In the second electrode 20, the width W1 and the pitch P1 of respective conductive parts 20a are set to satisfy the relationship of $W1 \geq -647AR+511$. More specifically, they are set to satisfy the relationship of $W1 \geq -647(1-W1/P1)+511$. Consequently, in the second electrode 20, the blur of a transmission image can be suppressed.

In the second electrode 20, favorably, the width W1 and the pitch P1 of respective conductive parts 20a are set to satisfy the relationship of $W1 \geq -647AR+557$. More specifically, they are set to satisfy the relationship of $W1 \geq -647(1-W1/P1)+557$. Consequently, in the second electrode 20, the blur of a transmission image can more suitably be suppressed. Also in respective relational formulae, the unit of each of Ws, Ps, W1 and P1 is micrometer.

In the organic electroluminescent device 110 according to the embodiment, the width W1 and the pitch P1 of respective conductive parts 20a satisfy the relationship of $W1 \geq -647(1-W1/P1)+511$. Consequently, the blur of a transmission image can be suppressed. Accordingly, the visibility of a transmission image can be enhanced. Furthermore, the width W1 and the pitch P1 satisfy the relationship of $W1 \geq -647(1-W1/P1)+557$. Consequently, visibility of a transmission image can be further enhanced.

The width W1 of each of conductive parts 20a and the pitch P1 of each of conductive parts 20a are not necessarily the same for each of respective conductive parts 20a. The width W1 and the pitch P1 of each of conductive parts 20a may be different in the range that satisfies the above-described relationship.

The inventors of the application furthermore performed an experiment whether a transmission image blurs or not. In the experiment, the number of examinees was set to be three.

The eyesight of an examinee D is 1.5 in naked eyesight. The eyesight of an examinee E is 1.5 in corrected eyesight. The eyesight of an examinee F is 0.8 in corrected eyesight. Then, evaluations were performed while changing the distance L2 to 0.6 m, 1.2 m, 2.4 m, 4.8 m, 6 m or 10 m. Other experimental conditions are substantially the same as above.

FIGS. 9A to 9D, FIGS. 10A to 10D, FIGS. 11A to 11D, FIGS. 12A to 12D, FIGS. 13A to 13D, and FIGS. 14A to 14D are tables showing examples of test results.

FIGS. 9A to 9D show evaluation results of respective samples when $L2=0.6$ m.

FIGS. 10A to 10D show evaluation results of respective samples when $L2=1.2$ m.

FIGS. 11A to 11D show evaluation results of respective samples when $L2=2.4$ m.

FIGS. 12A to 12D show evaluation results of respective samples when $L2=4.8$ m.

FIGS. 13A to 13D show evaluation results of respective samples when $L2=6$ m.

FIGS. 14A to 14D show evaluation results of respective samples when $L2=10$ m.

In FIGS. 9 to 14, A is evaluation results of respective samples having width $Ws=50$ μm, B is evaluation results of respective samples having width $Ws=100$ μm, C is evaluation results of respective samples having width $Ws=150$ μm, and D is evaluation results of respective samples having width $Ws=200$ μm.

In the experiment, the average of evaluations of respective examinees was obtained for each of respective samples. In FIGS. 9 to 14, the average of samples that all examinees determined to be "oo" is set to "oo," the average of samples that at least any one of respective examinees determined to be "o" is set to "o," and the average of samples that all examinees determined to be "x" is set to "x." As shown in FIGS. 9 to 14, in the experiment, the evaluation of the blur of a transmission image did not largely change depending on the eyesight, or with or without correction of examinees.

FIGS. 15A to 15F are graphs showing respective examples of test results.

Figure 15A:
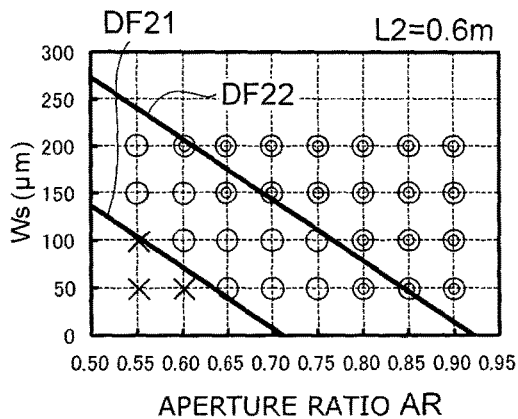
FIGS. 15A to 15F are graphs showing respective examples of test results.

FIG. 15A is a graph obtained by putting together test results when the distance $L2=0.6$ m.

Figure 15B:
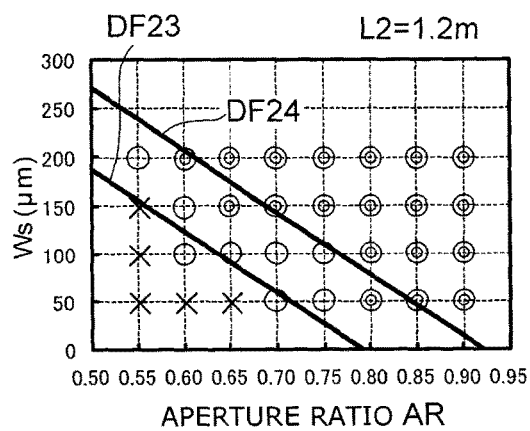

FIG. 15B is a graph obtained by putting together test results when the distance $L2=1.2$ m.

Figure 15C:
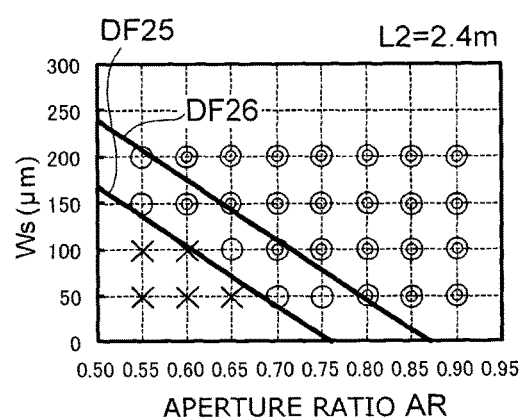

FIG. 15C is a graph obtained by putting together test results when the distance $L2=2.4$ m.

Figure 15D:
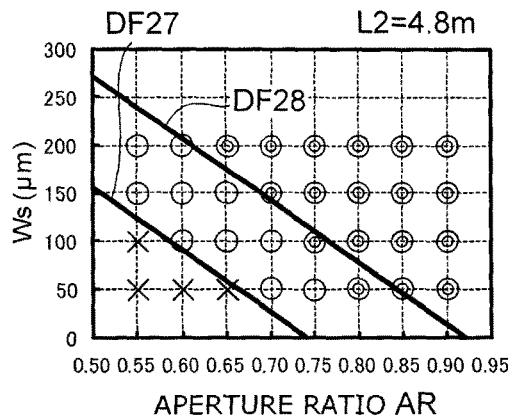

FIG. 15D is a graph obtained by putting together test results when the distance $L2=4.8$ m.

Figure 15E:
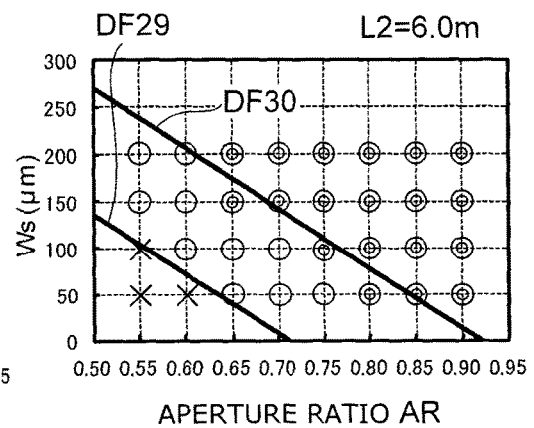

FIG. 15E is a graph obtained by putting together test results when the distance $L2=6.0$ m.

Figure 15F:
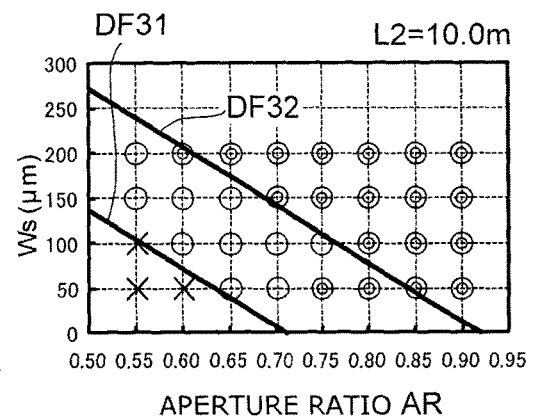

FIG. 15F is a graph obtained by putting together test results when the distance $L2=10.0$ m.

In FIGS. 15A to 15F, averages of evaluations of respective examinees are put together.

As shown in FIG. 15A, when the distance $L2=0.6$ m, the threshold value of the blur of a transmission image in the case where the evaluation value of "o" is accepted can be represented by a linear function of DF21. The linear function DF21 is, specifically, $Ws=-647AR+459$. Furthermore, when the distance $L2=0.6$ m, the threshold value of the blur of a transmission image in the case where the evaluation value of "o" is not accepted can be represented by a linear function of DF22. The linear function DF22 is, specifically, Ws=−647AR+595.

As shown in FIG. 15B, when the distance L2=1.2 m, the threshold value of the blur of a transmission image in the case where the evaluation value of "o" is accepted can be represented by a linear function of DF23. The linear function DF23 is, specifically, Ws=−647AR+511. Further, when the distance L2=1.2 m, the threshold value of the blur of a transmission image in the case where the evaluation value of "o" is not accepted can be represented by a linear function of DF24. The linear function DF24 is, specifically, Ws=−647AR+595.

As shown in FIG. 15C, when the distance L2=2.4 m, the threshold value of the blur of a transmission image in the case where the evaluation value of "o" is accepted can be represented by a linear function of DF25. The linear function DF25 is, specifically, Ws=−647AR+492. In addition, when the distance L2=2.4 m, the threshold value of the blur of a transmission image in the case where the evaluation value of "o" is not accepted can be represented by a linear function of DF26. The linear function DF26 is, specifically, Ws=−647AR+563.

As shown in FIG. 15D, when the distance L2=4.8 m, the threshold value of the blur of a transmission image in the case where the evaluation value of "o" is accepted can be represented by a linear function of DF27. The linear function DF27 is, specifically, Ws=−647AR+479. Furthermore, when the distance L2=4.8 m, the threshold value of the blur of a transmission image in the case where the evaluation value of "o" is not accepted can be represented by a linear function of DF28. The linear function DF28 is, specifically, Ws=−647AR+595.

As shown in FIG. 15E, when the distance L2=6.0 m, the threshold value of the blur of a transmission image in the case where the evaluation value of "o" is accepted can be represented by a linear function of DF29. The linear function DF29 is, specifically, Ws=−647AR+459. Moreover, when the distance L2=6.0 m, the threshold value of the blur of a transmission image in the case where the evaluation value of "o" is not accepted can be represented by a linear function of DF30. The linear function DF30 is, specifically, Ws=−647AR+595.

As shown in FIG. 15F, when the distance L2=10.0 m, the threshold value of the blur of a transmission image in the case where the evaluation value of "o" is accepted can be represented by a linear function of DF31. The linear function DF31 is, specifically, Ws=−647AR+459. Furthermore, when the distance L2=10.0 m, the threshold value of the blur of a transmission image in the case where the evaluation value of "o" is not accepted can be represented by a linear function of DF32. The linear function DF32 is, specifically, Ws=−647AR+595.

Figure 16:
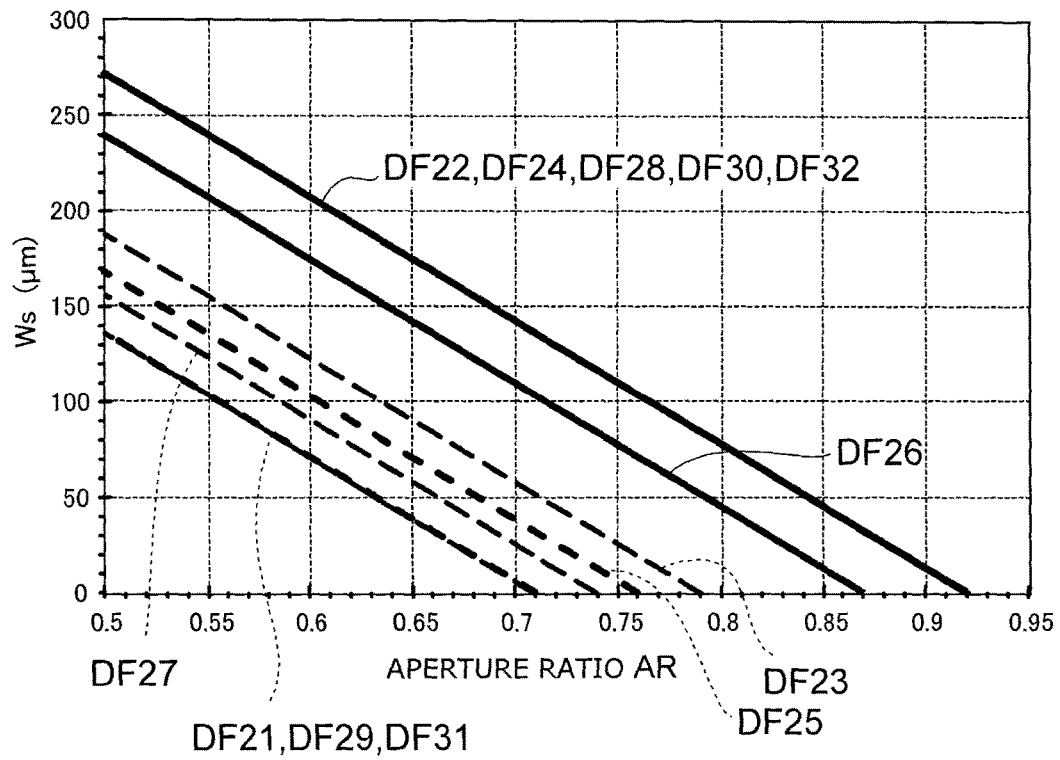
FIG. 16 is a graph showing an example of test results.

FIG. 16 is a graph showing an example of test results.

In FIG. 16, linear functions DF21 to DF32 obtained from FIGS. 15A to 15F are shown together.

As shown in FIG. 16, the strictest evaluation result when the evaluation value of "o" is accepted is the DF23. Furthermore, the strictest evaluation result when the evaluation value of "o" is not accepted is the DF22, DF24, DF28, DF30 and DF32. That is, also in the experiment, the strictest evaluation result was obtained when the distance L2=1.2 m.

In the second electrode 20, the width W1 and the pitch P1 of respective conductive parts 20a are set to satisfy the relationship of W1≤−647AR+511. More specifically, they are set to satisfy the relationship of W1≤−647(1−W1/P1)+511. Consequently, in the second electrode 20, the blur of a transmission image can be suppressed.

In the second electrode 20, favorably, the width W1 and the pitch P1 of respective conductive parts 20a are set to satisfy the relationship of W1≤−647AR+595. More specifically, they are set to satisfy the relationship of W1≥647(1−W1/P1)+595. Consequently, in the second electrode 20, the blur of a transmission image can more suitably be suppressed. Also in the above-described relational formulae, the unit of each of Ws, Ps, W1, and P1 is micrometer.

In the organic electroluminescent device 110 according to the embodiment, the width W1 and the pitch P1 of respective conductive parts 20a satisfy the relationship of W1≤−647(1−W1/P1)+511. Consequently, the blur of a transmission image can be suppressed. Accordingly, the visibility of a transmission image can be enhanced. Furthermore, the width W1 and the pitch P1 satisfy the relationship of W1≥−647(1−W1/P1)+595. Consequently, the visibility of a transmission image can be further enhanced.

Figure 17:
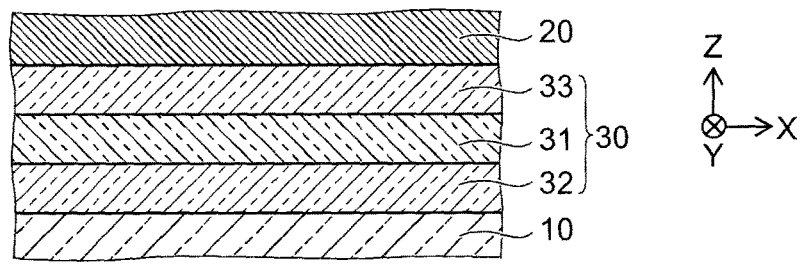
FIG. 17 is a schematic cross-sectional view showing a part of the organic electroluminescent device according to the first embodiment.

FIG. 17 is a schematic cross-sectional view showing a part of the organic electroluminescent device according to the first embodiment.

As shown in FIG. 17, the organic light emitting layer 30 includes a first layer 31. The organic light emitting layer 30 can furthermore include, as appropriate, at least any one of a second layer 32 and a third layer 33. The first layer 31 emits light including wavelengths of visible light. The second layer 32 is provided between the first layer 31 and the first electrode 10. The third layer 33 is provided between the first layer 31 and the second electrode 20.

For example, a material such as Alq$_3$ (tris(8-hydroxyquinolinolato)aluminum), F8BT (poly(9,9-dioctylfluorene-co-benzothiadiazole) or PPV (poly(p-phenylenevinylene)) can be used for the first layer 31. A mixing material of a host material and a dopant added to the host material can be used for the first layer 31. As the host material, for example, CBP (4,4'-N,N'-bis(dicarbazolyl-biphenyl)), BCP (2,9-dimethyl-4,7-diphenyl-1,10-phenanthroline), TPD (4,4'-bis-N-3-methylphenyl-N-phenylaminobiphenyl), PVK (polyvinyl carbazole), PPT (poly(3-phenylthiophene)) or the like can be used as the host material. For example, FIrpic (iridium (III) bis(4,6-di-fluorophenyl)-pyridinate-N,C2'-picolinate), Ir(ppy)$_3$ (tris (2-phenylpyridine)iridium), FIr6 (bis(2,4-difluorophenylpyridinate)-tetrakis(1-pyrazolyl)borate-iri dium (III)) or the like can be used as a dopant material.

The second layer 32 functions as, for example, a hole injection layer. The hole injection layer includes at least any of, for example, PEDPOT: PPS (poly(3,4-ethylenedioxythiophene)-poly(styrenesulfonate)), CuPc (copper phthalocyanine), MoO$_3$ (molybdenumtrioxide), and the like. The second layer 32 functions as, for example, a hole transport layer. The hole transport layer includes at least any of, for example, a-NPD (4,4'-bis[N-(1-naphthyl)-N-phenylamino] biphenyl), TAPC (1,1-bis[4-[N,N-di(p-tolyl)amino]phenyl] cyclohexane), m-MTDATA (4,4',4"-tris[phenyl(m-tolyl) amino]triphenylamine), TPD (bis(3-methylphenyl)-N,N'-diphenylbenzidine), TCTA (4,4',4"-tri(N-carbazolyl) triphenylamine), and the like. The second layer 32 may have a stacked structure, for example, of a layer functioning as a hole injection layer and a layer functioning as a hole transport layer. The second layer 32 may include a layer other than the layer functioning as a hole injection layer and a layer functioning as a hole transport layer.

The third layer 33 may include a layer functioning as, for example, an electron injection layer. The electron injection layer includes at least any of, for example, lithium fluoride, cesium fluoride, lithium quinoline complex, and the like.

The third layer 33 can include a layer functioning as, for example, an electron transport layer. The electron transport layer includes at least any of, for example, Alq3 (tris(8-quinolinolate)aluminum (III)), BAlq (bis(2-methyl-8-quinolilate)(p-phenylphenolate)aluminum), Bphen (bathophenanthroline), 3TPYMB (tris[3-(3-pyridyl)-mesityl]borane), and the like. The third layer 33 may have a stacked structure, for example, of a layer functioning as an electron injection layer and a layer functioning as an electron transport layer. The third layer 33 may include a layer other than the layer functioning as an electron injection layer and a layer functioning as an electron transport layer.

For example, the light emitted from the organic light emitting layer 30 is substantially white light. That is, the light emitted from the organic electroluminescent device 110 is white light. Here, "white light" is substantially white and also includes, for example, reddish, yellowish, greenish, bluish, and purplish white light.

The first electrode 10 contains an oxide containing at least one device selected from the group consisting of, for example, In, Sn, Zn and Ti. For example, a film of indium oxide, zinc oxide, tin oxide or indium tin oxide (ITO), a film manufactured using a conductive glass containing fluorine-doped tin oxide (FTO) or indium zinc oxide (such as NESA), gold, platinum, silver, copper or the like can be used for the first electrode 10. The first electrode 10 functions as, for example, an anode.

The second electrode 20 contains, for example, at least one of aluminum and silver. For example, for the second electrode 20, an aluminum film is used. Furthermore, as the second electrode 20, an alloy of silver and magnesium may be used. Calcium may be added to the alloy. The second electrode 20 functions as, for example, a cathode.

Alternatively, it is also possible to form the first electrode 10 as a stacked structure of a light reflective electrode and a light transmissive electrode (such as a transparent electrode) and to pattern the same into a stripe-like shape or a grid-like shape, to thereby form the second electrode 20 as a light transmissive electrode (such as a transparent electrode). Consequently, a top emission type organic electroluminescent device 110 may be produced.

It is also possible to set the first electrode 10 as a cathode, to set the second electrode 20 as an anode, to cause the second layer 32 to function as an electron injection layer or an electron transport layer, and to cause the third layer 33 to function as a hole injection layer or a hole transport layer.

As the insulating layer 40, for example, an insulating resin material such as polyimide resin or acrylic resin, or an insulating inorganic material such as a silicon oxide film (such as $SiO_2$), a silicon nitride film (such as SiN) or a silicon oxynitride film is used.

The thickness of the first electrode 10 (the length in the Z-axis direction) is, for example, not less than 10 nm and not more than 500 nm. Favorably, the thickness is not less than 50 nm and not more than 200 nm. The thickness of the insulating part 40a is, for example, not less than 1 μm and not more than 100 μm. The thickness of the organic light emitting layer 30 is, for example, not less than 50 nm and not more than 500 nm. The thickness of the second electrode 20 (the conductive part 20a) is, for example, not less than 10 nm and not more than 300 nm. The width W1 of the conductive part 20a (the length in the X-axis direction) is, for example, not less than 1 μm and not more than 500 μm. The pitch P1 of the plurality of conductive parts 20a is, for example, not less than 2 μm and not more than 2000 μm. More preferably, the pitch is not less than 2 μm and not more than 200 μm. The width W2 of the insulating part 40a is, for example, not less than 1 μm and not more than 1500 μm. The pitch Pt2 of the insulating part 40a is, for example, not less than 2 μm and not more than 2000 μm.

In the range of the above-described numerical values, the width W1 and the pitch P1 of respective conductive parts 20a are set so as to satisfy the relationship of $W1 \geq -647(1-W1/P1)+511$. Consequently, high visibility of a transmission image can be obtained.

Figure 18:
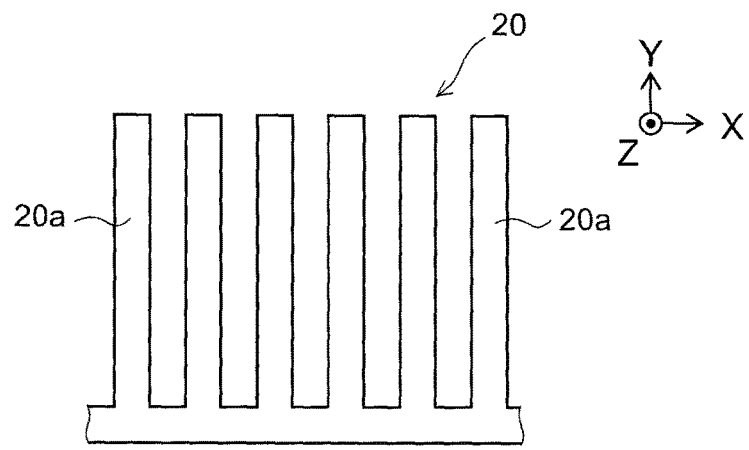
FIG. 18 is a schematic plan view showing a part of another organic electroluminescent device according to the first embodiment.

FIG. 18 is a schematic plan view showing a part of another organic electroluminescent device according to the first embodiment.

As shown in FIG. 18, the pattern shape of the second electrode 20 may be a comb-tooth shape. That is, the second electrode 20 may include a plurality of conductive parts 20a that extend in the Y-axis direction and are arranged side by side in the X-axis direction, and a part linking respective conductive parts 20a. In this way, the conductive part 20a may be a part of the second electrode 20.

Figure 19A:
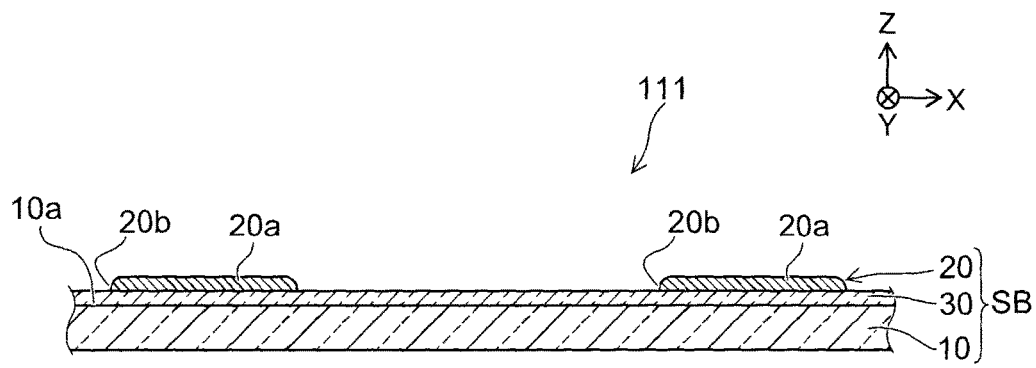
FIGS. 19A and 19B are schematic cross-sectional views showing other organic electroluminescent devices according to the first embodiment.
Figure 19B:
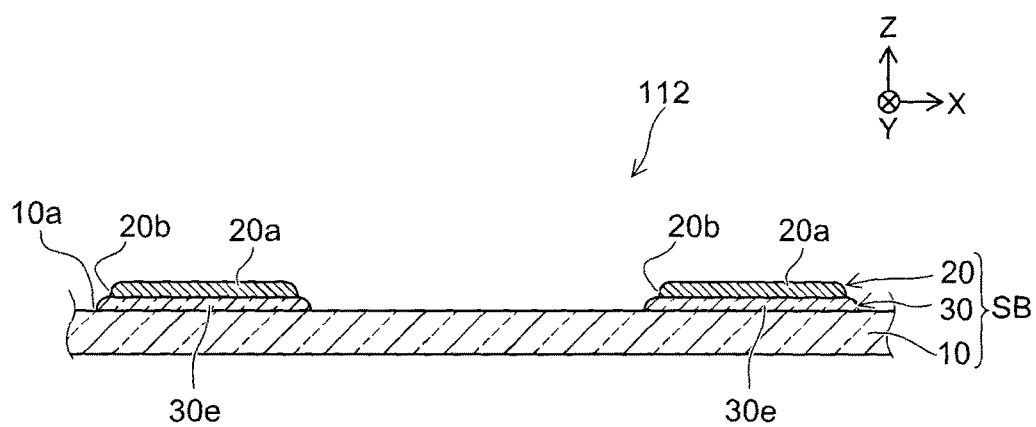

FIGS. 19A and 19B are schematic cross-sectional views showing other organic electroluminescent devices according to the first embodiment.

As shown in FIG. 19A, in an organic electroluminescent device 111, the organic light emitting layer 30 is provided on the upper face 10a of the first electrode 10. That is, the insulating layer 40 is omitted. The organic light emitting layer 30 makes contact with, for example, the upper face 10a. In this way, the insulating layer 40 is provided as appropriate, and can be omitted.

As shown in FIG. 19B, in an organic electroluminescent device 112, the organic light emitting layer 30 includes a plurality of light emitting parts 30e. Each of the plurality of light emitting parts 30e is provided between each of the plurality of conductive parts 20a and the first electrode 10. As described above, the organic light emitting layer 30 need not be provided on the whole of the first electrode 10. It is sufficient that the organic light emitting layer 30 includes at least a part provided between the first electrode 10 and the conductive part 20a. That is, the organic light emitting layer 30 may include at least a part serving as an emission region EA.

Figure 20A:
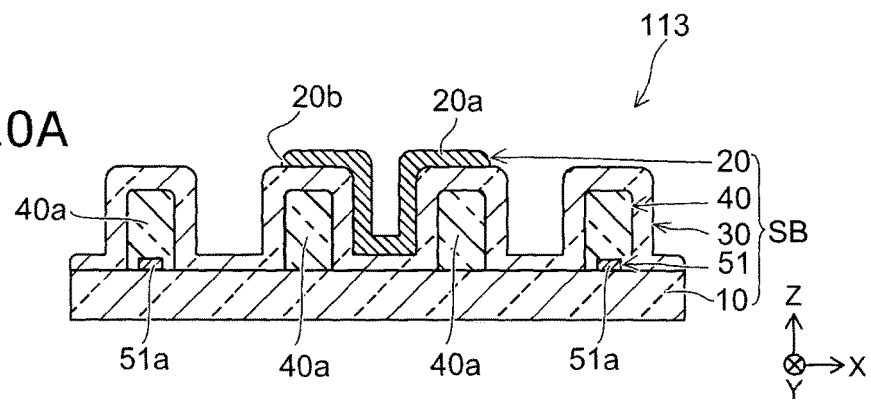
FIGS. 20A to 20C are schematic views showing another organic electroluminescent device according to the first embodiment.
Figure 20B:
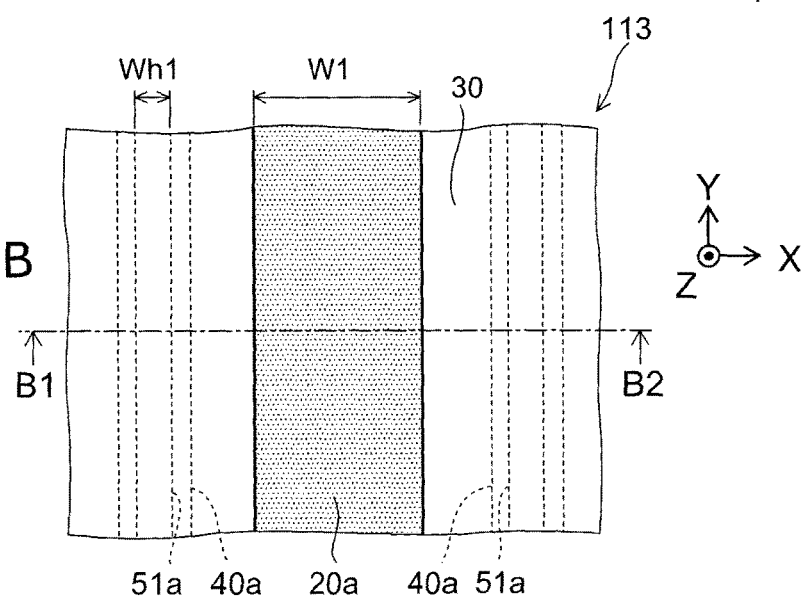
Figure 20C:
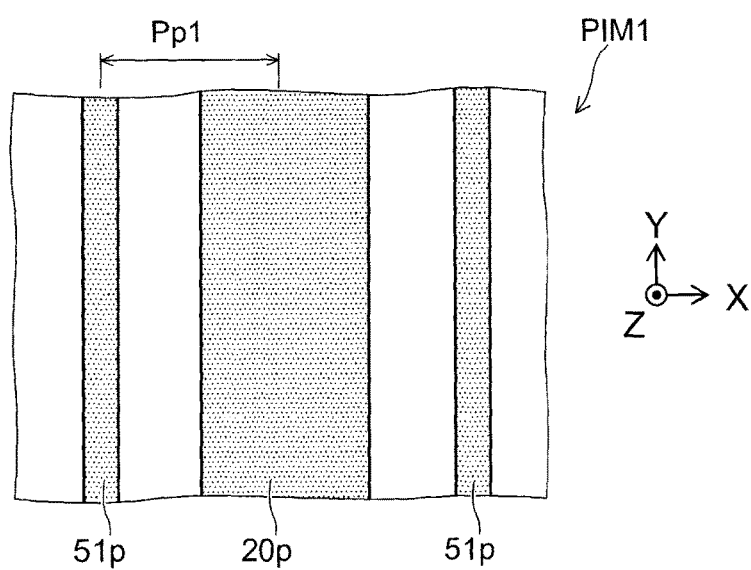

FIGS. 20A to 20C are schematic views showing another organic electroluminescent device according to the first embodiment.

FIG. 20A is a schematic cross-sectional view of an organic electroluminescent device 113, and FIG. 20B is a schematic plan view of the organic electroluminescent device 113. FIG. 20A shows schematically the cross-section along a B1-B2 line in FIG. 20B. FIG. 20C shows a projected image PIM1 obtained when a part of the organic electroluminescent device 113 is projected onto the X-Y plane.

As shown in FIGS. 20A to 20C, the stacked body SB of the organic electroluminescent device 113 furthermore includes a first wiring layer 51 (a wiring layer).

The first wiring layer 51 extends along a plane parallel to the upper face 10a. That is, the first wiring layer 51 extends in the X-Y plane. In the example, the first wiring layer 51 is provided on the upper face 10a of the first electrode 10. The first wiring layer 51 is provided, for example, between the first electrode 10 and the insulating layer 40. The first wiring layer 51 may be provided on the plane opposite to the upper face 10a of the first electrode 10.

The first wiring layer 51 includes a conductive first wiring part 51a (a wiring part). The first wiring layer 51 includes, for example, a plurality of first wiring parts 51a. The first wiring part 51a is provided between the first electrode 10 and the insulating part 40a. Each of the plurality of first wiring parts 51a, for example, extends in the Y-axis direction and is arranged side by side in the X-axis direction. The space between each of the plurality of first wiring parts 51a is, for example, constant. Furthermore, the space between each of the plurality of first wiring parts 51a is, for example, wider than the space between each of the plurality of conductive parts 20a. In the example, the pattern shape of the first wiring layer 51 is a stripe-like shape. The pattern shape of the first wiring layer 51 may be a comb-tooth shape, or the like. In the first wiring layer 51, a part of the first electrode 10 is exposed. In other words, the first wiring layer 51 has one or a plurality of openings from which a part of the first electrode 10 is exposed.

The first wiring layer 51 is electrically connected to the first electrode 10. The first wiring layer 51 makes contact with, for example, the first electrode 10. The electric conductivity of the first wiring layer 51 is higher than the electric conductivity of the first electrode 10. The first wiring layer 51 has light reflectivity. The light reflectance of the first wiring layer 51 is higher than the light reflectance of the first electrode 10. The first wiring layer 51 is, for example, metal wiring. The first wiring layer 51 functions as, for example, an auxiliary electrode that transmits a current flowing to the first electrode 10. Consequently, in the organic electroluminescent device 113, for example, a current volume flowing in the direction parallel to the upper face 10a of the first electrode 10 can be made uniform, as compared with the organic electroluminescent device 110. For example, the emission luminance in the plane can be made more uniform.

As shown in FIG. 20C, in the organic electroluminescent device 113, the projected image PIM1 when projecting the second electrode 20 and the first wiring layer 51 onto the X-Y plane includes each of a plurality of projected images 20p of the plurality of conductive parts 20a and each of a plurality of projected images 51p of the plurality of first wiring parts 51a. The projected image PIM1 is, in other words, the shape of the light reflective part of the organic electroluminescent device 113.

The width of the first wiring part 51a is set to Wh1 (Wh). The pitch of the projected image 20p of the conductive part 20a and the projected image 51p of the first wiring part 51a is set to Pp1 (Pp). The width Wh1 is, for example, the length of the first wiring part 51a in the X-axis direction. The pitch Pp1 is, for example, the distance in the X-axis direction between the center of the conductive part 20a in the X-axis direction and the center of the first wiring part 51a in the X-axis direction.

In the organic electroluminescent device 113, the width W1 of the conductive part 20a and the pitch Pp1 of the projected images satisfy the relationship of W1≤−647(1−W1/Pp1)+511. Furthermore, the width Wh1 of the first wiring part 51a and the pitch Pp1 of the projected images satisfy the relationship of Wh1≥−647(1−Wh1/Pp1)+511. That is, in the shape of the light reflective part of the organic electroluminescent device 113, the relationship of the width and the pitch explained regarding the organic electroluminescent device 110 is satisfied.

Consequently, in the organic electroluminescent device 113, too, high visibility of a transmission image can be obtained. In the above relational formulae, the unit of each of W1, Wh1 and Pp1 is micrometer.

The first wiring layer 51 contains at least one device selected from the group consisting, for example, of Mo, Ta, Nb, Al, Ni and Ti. The first wiring layer 51 can be made to be a mixed film containing, for example, a device selected from the group. The first wiring layer 51 can be made to be a stacked film containing these devices. For example, a stacked film of Nb/Mo/Al/Mo/Nb can be used for the first wiring layer 51. The first wiring layer 51 functions as, for example, an auxiliary electrode that suppresses the potential drop of the first electrode 10. The first wiring layer 51 can function as a lead electrode for supplying a current.

Figure 21A:
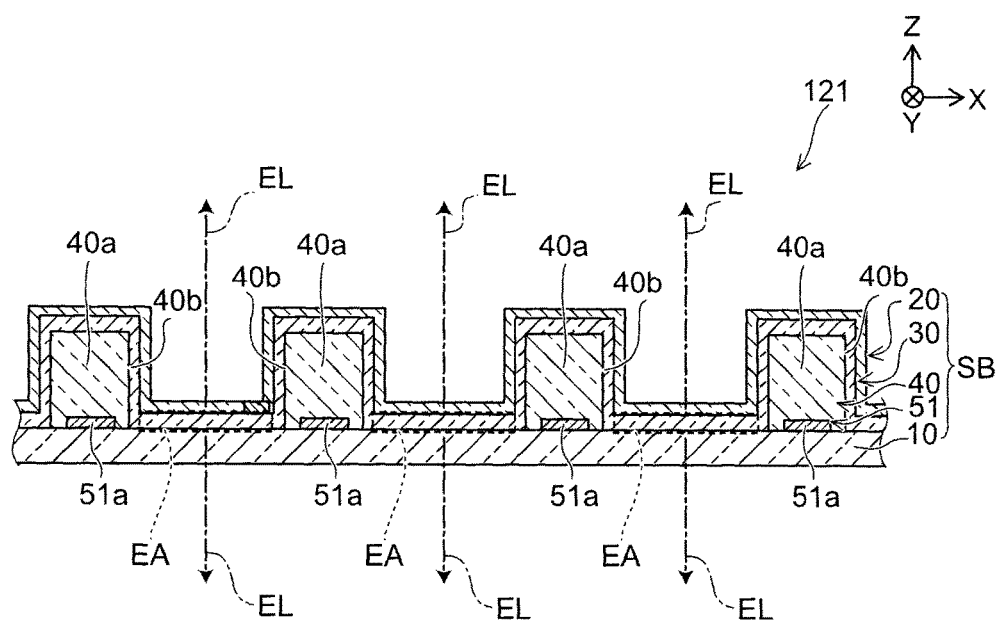
FIGS. 21A and 21B are schematic views showing another organic electroluminescent device according to the first embodiment.
Figure 21B:
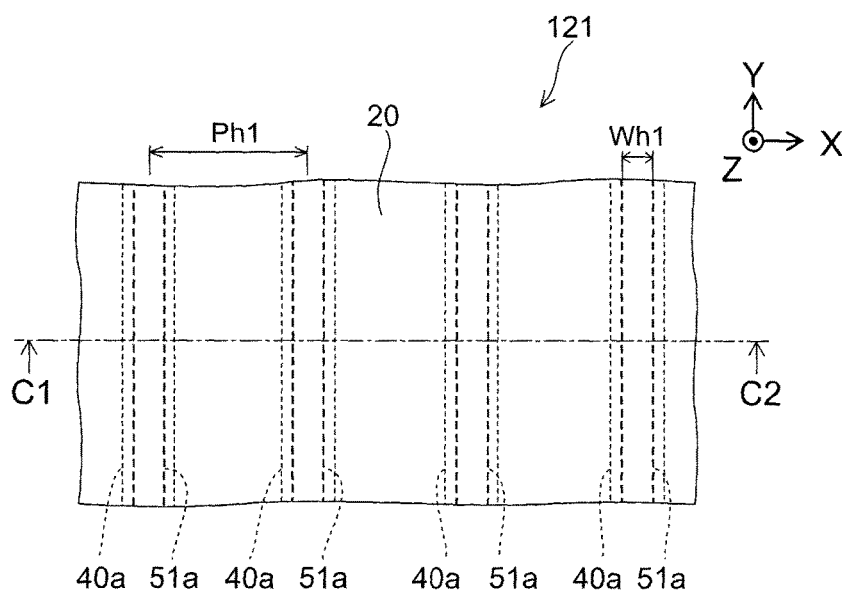

FIGS. 21A and 21B are schematic views showing another organic electroluminescent device according to the first embodiment.

FIG. 21A is a schematic cross-sectional view of an organic electroluminescent device 121, and FIG. 21B is a schematic plan view of the organic electroluminescent device 121. FIG. 21A shows the cross-section along a C1-C2 line in FIG. 21B.

As shown in FIGS. 21A and 21B, in the organic electroluminescent device 121, the second electrode 20 is provided on the organic light emitting layer 30. For example, the second electrode 20 is provided on the whole of the organic light emitting layer 30. In the example, the second electrode 20 has light permeability. The second electrode 20 is, for example, transparent.

Consequently, in the organic electroluminescent device 121, when a current is flown through the organic light emitting layer 30 by using the first electrode 10 and the second electrode 20, the emission EL emitted from the emission region EA goes out of the organic electroluminescent device 121 via the first electrode 10, and goes out of the organic electroluminescent device 121 via the second electrode 20. That is, the organic electroluminescent device 121 is of a double-side light emission type.

In the organic electroluminescent device 121, the stacked body SB includes the first wiring layer 51. The first wiring layer 51 is provided between the first electrode 10 and the insulating layer 40. The first wiring layer 51 includes a plurality of first wiring parts 51a. In the example, each of the plurality of first wiring parts 51a is disposed, for example, in a position that overlaps with each of the plurality of insulating parts 40a when being projected onto the X-Y plane. Each of the plurality of first wiring parts 51a does not necessarily overlap with each of the plurality of insulating parts 40a.

The width of the first wiring part 51a is set to Wh1. The pitch of each of the plurality of first wiring parts 51a is set to Ph1. The pitch Ph1 is, for example, the distance in the X-axis direction between centers of two adjacent first wiring parts 51a in the X-axis direction.

In the organic electroluminescent device 121, the width Wh1 and the pitch Ph1 satisfy the relationship of Wh1≥−647(1−Wh1/Ph1)+511.

Consequently, in the organic electroluminescent device 121, too, high visibility of a transmission image can be obtained. In the above relational formula, the unit of each of Wh1 and Ph1 is micrometer.

For example, materials explained regarding the first electrode 10 can be used for the transparent second electrode 20. Furthermore, the transparent second electrode 20 may be, for example, of a metal material such as MgAg. In the metal material, the thickness of the second electrode 20 is set to be not less than 5 nm and not more than 20 nm. Consequently, suitable light permeability can be obtained.

Figure 22A:
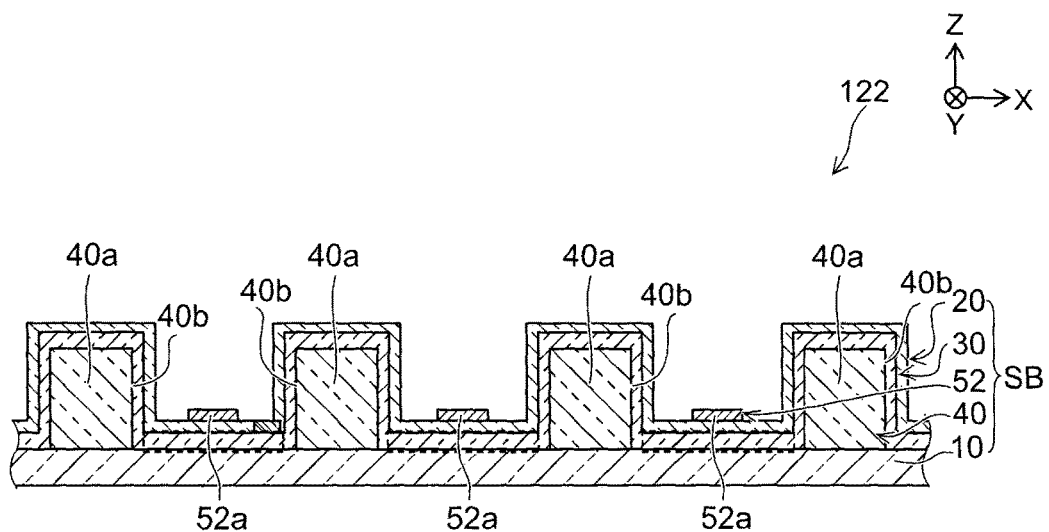
FIGS. 22A and 22B are schematic views showing another organic electroluminescent device according to the first embodiment.
Figure 22B:
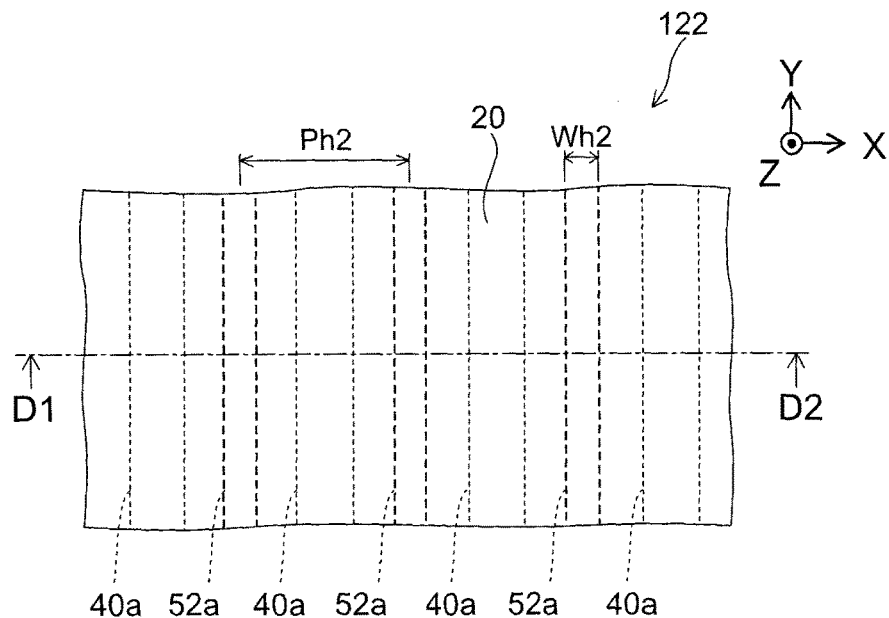

FIGS. 22A and 22B are schematic views showing another organic electroluminescent device according to the first embodiment.

FIG. 22A is a schematic cross-sectional view of an organic electroluminescent device 122, and FIG. 22B is a schematic plan view of the organic electroluminescent device 122. FIG. 22A shows a cross-section along a D1-D2 line in FIG. 22B.

As shown in FIGS. 22A and 22B, in the organic electroluminescent device 122, the stacked body SB furthermore includes a second wiring layer 52 (a wiring layer). The second wiring layer 52 is provided on the second electrode 20. The second wiring layer 52 has a plurality of second wiring parts 52a (a wiring part). Each of the plurality of second wiring parts 52a extends in the Y-axis direction, and is arranged side by side in the X-axis direction. The second wiring layer 52 allows a part of the second electrode 20 to be exposed. The second wiring layer 52 allows a part of the second electrode 20 to be exposed, for example, between each of the plurality of second wiring parts 52a. In the example, the second wiring layer 52 has a stripe-like pattern shape. The pattern shape of the second wiring layer 52 may be, for example, a comb-tooth shape.

In the example, each of the plurality of second wiring parts 52a is disposed in a position that does not overlap with each of the plurality of insulating parts 40a when being projected onto the X-Y plane. Each of the plurality of second wiring parts 52a may be disposed in a position that overlaps with each of the plurality of insulating parts 40a, for example, when being projected onto the X-Y plane.

The second wiring layer 52 is electrically connected to the second electrode 20. The second wiring layer 52 makes contact with, for example, the second electrode 20. The electric conductivity of the second wiring layer 52 is higher than the electric conductivity of the second electrode 20. The second wiring layer 52 has light reflectivity. The light reflectance of the second wiring layer 52 is higher than the light reflectance of the second electrode 20. The second wiring layer 52 is, for example, of metal wiring. The second wiring layer 52 functions as, for example, an auxiliary electrode that transmits a current flowing to the second electrode 20. Consequently, in the organic electroluminescent device 122, for example, a current volume flowing in the X-Y plane direction of the second electrode 20 can be made more uniform. For example, the emission luminance in the plane can be made more uniform.

The width of the second wiring part 52a is assumed to be set to Wh2 (Wh). The pitch of each of the plurality of second wiring parts 52a is set to Ph2 (Ph). The width Wh2 is, for example, the length of the second wiring part 52a in the X-axis direction. The pitch Ph2 is, for example, the distance in the X-axis direction between centers of two adjacent first wiring parts 51a in the X-axis direction.

In the organic electroluminescent device 122, the width Wh2 and the pitch Ph2 satisfy the relationship of $Wh2 \geq -647(1-Wh2/Ph2)+511$.

Consequently, in the organic electroluminescent device 122, too, high visibility of a transmission image can be obtained. In the above relational formula, the unit of each of Wh2 and Ph2 is micrometer.

The second wiring layer 52 may be provided, for example, between the second electrode 20 and the organic light emitting layer 30. For the second wiring layer 52, for example, materials explained regarding the the first wiring layer 51 can be used.

Figure 23A:
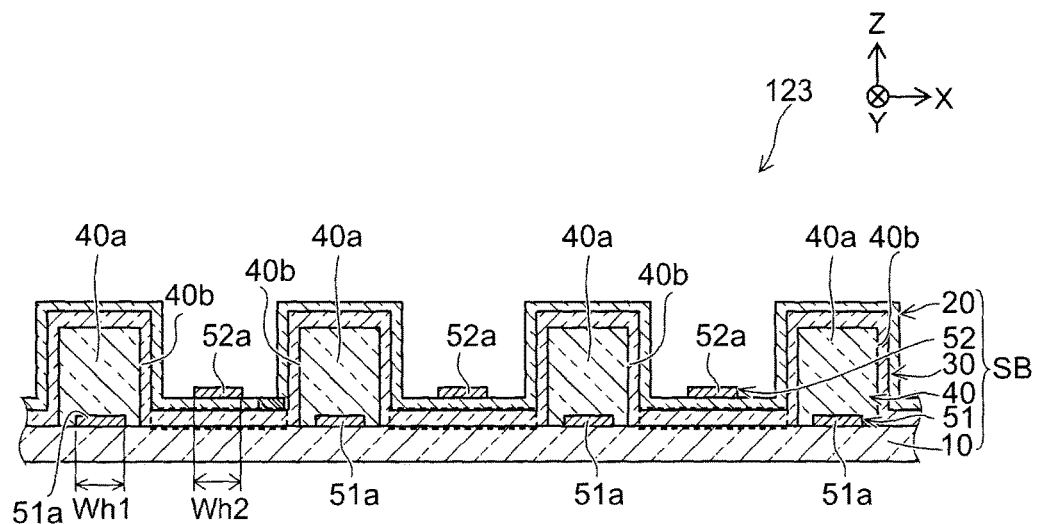
FIGS. 23A and 23B are schematic views showing another organic electroluminescent device according to the first embodiment.
Figure 23B:
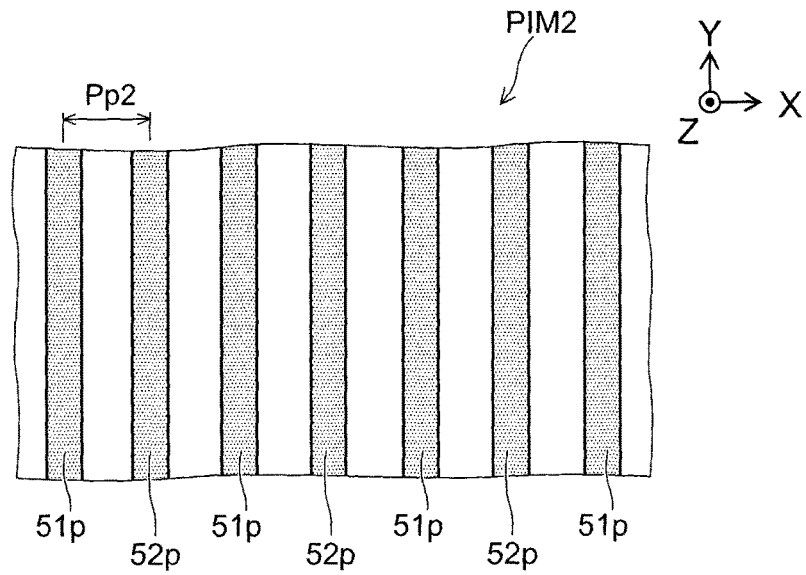

FIGS. 23A and 23B are schematic views showing another organic electroluminescent device according to the first embodiment.

FIG. 23A is a schematic cross-sectional view of an organic electroluminescent device 123. FIG. 23B shows a projected image PIM2 when a part of the organic electroluminescent device 123 is projected onto the X-Y plane.

As shown in FIGS. 23A and 23B, the stacked body SB of the organic electroluminescent device 123 includes the first wiring layer 51 and the second wiring layer 52.

Each of the first wiring parts 51a is disposed, for example, in a position that overlaps with each of the insulating parts 40a when being projected onto the X-Y plane. Each of the first wiring parts 51a may be disposed, for example, in a position that does not overlap with each of the insulating parts 40a. The position of each of the first wiring parts 51a on the first electrode 10 is arbitrary. Each of the second wiring parts 52a is disposed, for example, in a position that does not overlap with each of the insulating parts 40a when being projected onto the X-Y plane. Each of the second wiring parts 52a may be disposed, for example, in a position that overlaps with each of the insulating parts 40a when being projected onto the X-Y plane. The position of each of the second wiring parts 52a on the second electrode 20 is arbitrary.

As shown in FIG. 23B, in the organic electroluminescent device 123, the projected image PIM2 when the first wiring layer 51 and the second wiring layer 52 are projected onto the X-Y plane includes a plurality of projected images 51p of each of the plurality of first wiring parts 51a and a plurality of projected images 52p of each of plurality of second wiring parts 52a.

The width of the first wiring part 51a is set to Wh1 (Wh). A pitch of the projected image 51p of the first wiring part 51a and the projected image 52p of the second wiring part 52a is set to Pp2 (Pp). The pitch Pp2 is, for example, the distance in the X-axis direction between the center of the first wiring part 51a in the X-axis direction and the center of the second wiring part 52a in the X-axis direction.

In the organic electroluminescent device 123, the width Wh1 of the first wiring part 51a and the pitch Pp2 of the projected image satisfy the relationship of $Wh1 \geq -647(1-Wh1/Pp2)+511$. Furthermore, the width Wh2 of the second wiring part 52a and the pitch Pp2 of the projected image satisfy the relationship of $Wh2 \geq -647(1-Wh2/Pp2)+511$.

Consequently, in the organic electroluminescent device 123, too, high visibility of a transmission image can be obtained. In the above relational formulae, the unit of each of Wh1, Wh2 and Pp1 is micrometer.

Figure 24:
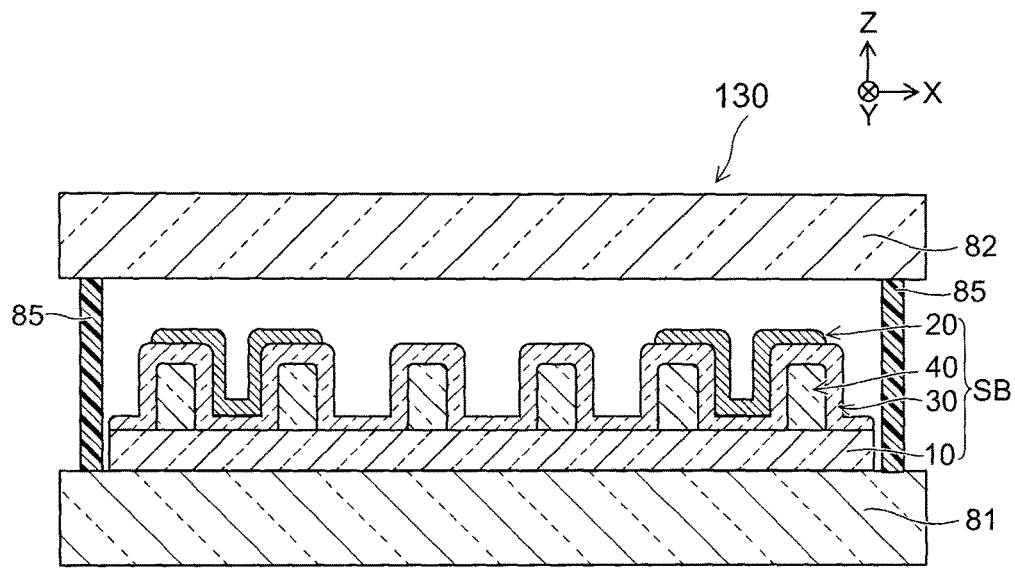
FIG. 24 is a schematic cross-sectional view showing another organic electroluminescent device according to the first embodiment.

FIG. 24 is a schematic cross-sectional view showing another organic electroluminescent device according to the first embodiment.

As shone in FIG. 24, an organic electroluminescent device 130 furthermore includes a first substrate 81, a second substrate 82 and a seal part 85.

The first electrode 10 is provided on the first substrate 81. The stacked body SB is provided on the first substrate 81. The first substrate 81 has light permeability. The second substrate 82 is provided on the stacked body SB, and faces first substrate 81. That is, the second substrate 82 is provided on the second electrode 20. The second substrate 82 has light permeability. In the example, the configuration of the stacked body SB is the same as the configuration explained regarding the organic electroluminescent device 110. The configuration of the stacked body SB may be the configuration explained regarding organic electroluminescent devices 111-113 and 121-123.

The seal part 85 is annularly provided along, for example, peripheries of the first substrate 81 and the second substrate 82, and unites the first substrate 81 with the second substrate 82. Consequently, the stacked body SB is sealed with the first substrate 81 and the second substrate 82. In the organic electroluminescent device 130, the distance between the first substrate 81 and the second substrate 82 in the Z-axis direction is regulated by the seal part 85. The configuration can be realized by, for example, incorporating a particulate spacer (illustration is omitted) in the seal part 85. For example, the distance between the first substrate 81 and the second substrate 82 is regulated by dispersing a plurality of particulate spacers in the seal part 85, and, by diameters of the plurality of spacers.

In the organic electroluminescent device 130, the thickness of the seal part 85 (length along the Z-axis direction) is, for example, not less than 1 μm and not more than 100 μm. More favorably, the thickness is, for example, not less than 5 μm and not more than 20 μm. Consequently, for example, permeation of moisture etc. can be suppressed. The thickness of the seal part 85 is, for example, substantially the same as the diameter of the spacer dispersed in the seal part 85.

Among organic electroluminescent devices, there is a configuration in which a concave part for housing a stacked body SB is provided for the second substrate 82. In the configuration, formation of the second substrate 82 becomes hard. For example, the formation leads to the increase in cost of the organic electroluminescent device.

In contrast, in the organic electroluminescent device 130 according to the embodiment, the distance between the first substrate 81 and the second substrate 82 is regulated with the seal part 85. Consequently, for example, a flat plate-like second substrate 82 can be used. For example, the second substrate 82 can be easily formed. The increase in cost of the organic electroluminescent device 130 can be suppressed.

The space between the stacked body SB and the second substrate 82 is filled, for example, with inert gas or the like. A desiccant or the like may be provided between the stacked body SB and the second substrate 82. The space between the stacked body SB and the second substrate 82 may be, for example, an air layer. The space between the stacked body SB and the second substrate 82 may be, for example, filled with a liquid acrylic-based resin or epoxy-based resin, or the like. Calcium oxide or barium oxide may be added, as a desiccant, to the acrylic-based resin or epoxy-based resin.

For example, a glass substrate, a resin substrate or the like is used as the first substrate 81 and the second substrate 82. For example, an ultraviolet ray-curable resin or the like is used for the seal part 85.

Second Embodiment

Figure 25:
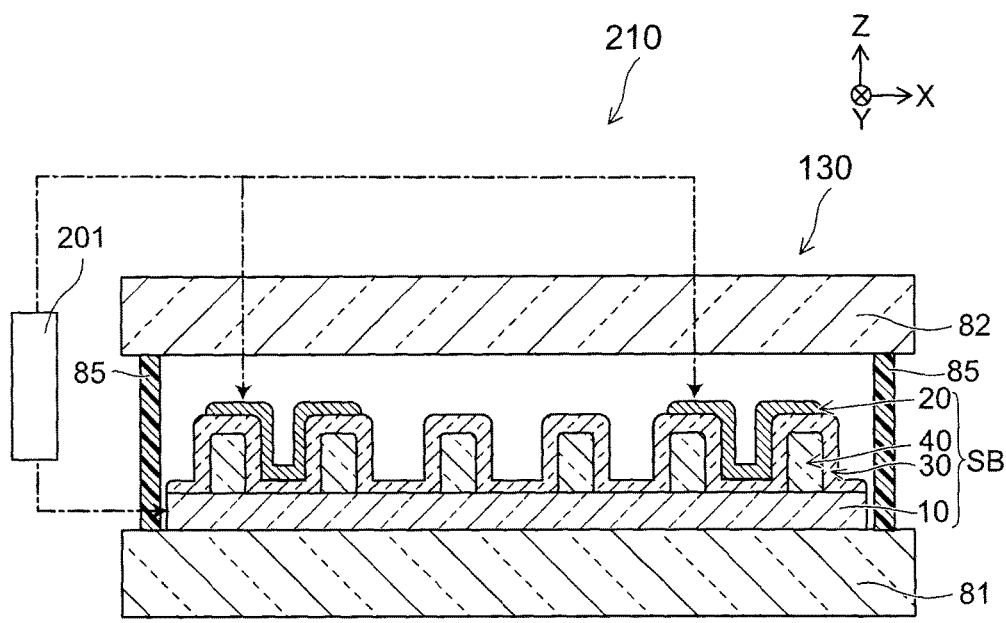
FIG. 25 is a schematic view showing the illumination apparatus according to a second embodiment.

FIG. 25 is a schematic view showing the illumination apparatus according to a second embodiment.

As shown in FIG. 25, an illumination apparatus 210 according to the embodiment includes the organic electroluminescent device according to the first embodiment (for example, the organic electroluminescent device 130) and a power source 201.

The power source 201 is connected electrically to the first electrode 10 and the second electrode 20. The power source 201 supplies a current to the organic light emitting layer 30 via the first electrode 10 and the second electrode 20.

An illumination apparatus having high visibility of a transmission image can be provided by using the illumination apparatus 210 according to the embodiment.

Third Embodiment

Figure 26A:
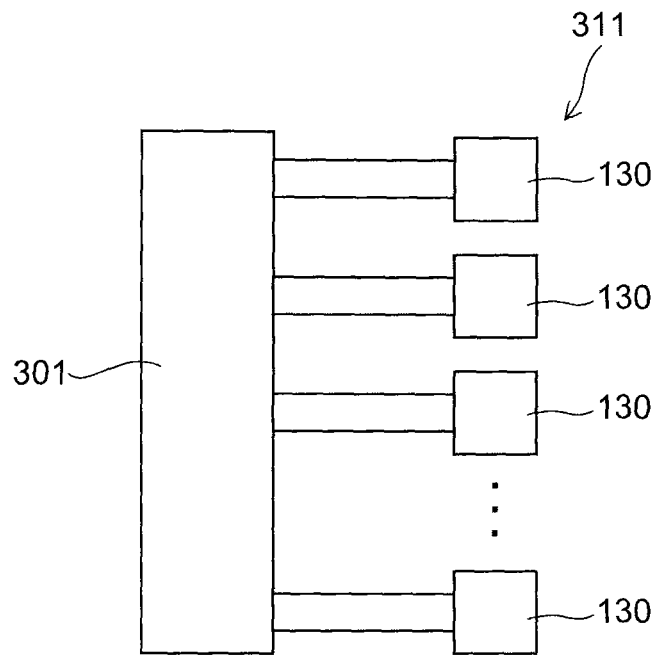
FIGS. 26A and 26B are schematic views showing illumination systems according to the third embodiment.
Figure 26B:
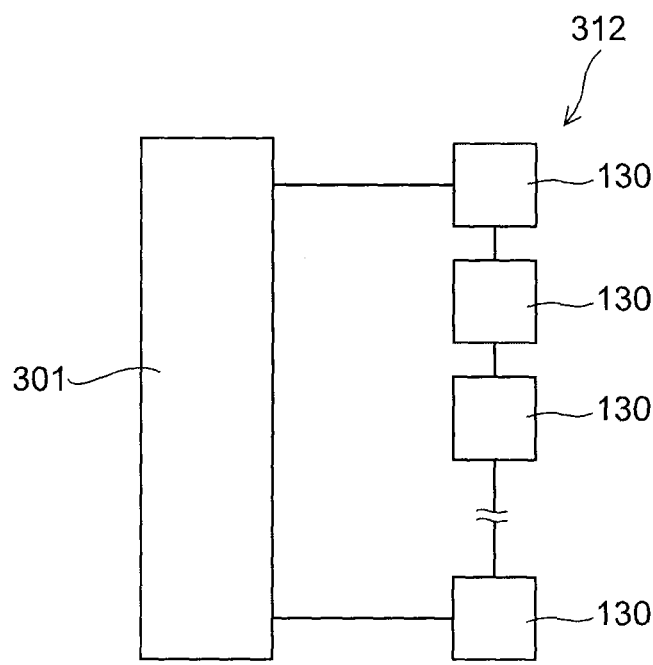

FIGS. 26A and 26B are schematic views showing illumination systems according to the third embodiment.

As shown in FIG. 26A, an illumination system 311 according to the embodiment includes the plurality of organic electroluminescent devices according to the first embodiment (for example, the organic electroluminescent device 130) and a controller 301.

The controller 301 is electrically connected to each of the plurality of organic electroluminescent devices 130, and controls turning on and off of each of the plurality of organic electroluminescent devices 130. The controller 301 is connected electrically, for example, with each of the first electrode 10 and the second electrode 20 of the plurality of organic electroluminescent devices 130. Consequently, the controller 301 controls individually the turning on and off of each of the plurality of organic electroluminescent devices 130.

As shown in FIG. 26B, in an illumination system 312, each of the plurality of organic electroluminescent devices 130 is connected in series. The controller 301 is electrically connected to the first electrode 10 of one organic electroluminescent device 130 among the plurality of organic electroluminescent devices 130. Further, the controller 301 is electrically connected to the second electrode 20 of another organic electroluminescent device 130 among the plurality of organic electroluminescent devices 130. Consequently, the controller 301 controls together turning on and off of each of the plurality of organic electroluminescent devices 130. As described above, the controller 301 may control individually turning on and off of each of the plurality of organic electroluminescent devices 130, or may control these together.

According to illumination systems 311, 312 according to the embodiment, an illumination system showing high visibility of a transmission image can be provided.

According to the embodiment, an organic electroluminescent device, illumination apparatus and illumination system having high visibility of a transmission image can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in organic electroluminescent devices, illumination apparatuses, and illumination systems such as first electrodes, second electrodes, organic light emitting layers, first wiring layers, second wiring layers, power sources, controllers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all organic electroluminescent devices, illumination apparatuses, and illumination systems practicable by an appropriate design modification by one skilled in the art based on the organic electroluminescent devices, illumination apparatuses, and illumination systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device, comprising:
a first electrode having an upper face, the first electrode being light transmissive;
an organic light emitting layer provided on the first electrode;
a second electrode provided on the organic light emitting layer, the second electrode including a plurality of conductive parts, the conductive parts extending in a first direction parallel to the upper face and being arranged in a second direction, the second direction being parallel to the upper face and intersecting with the first direction, the second electrode being light reflective, and
when a length of each of the conductive parts in the second direction is set to W1 (micrometer), and
a pitch of each of the conductive parts is set to P1 (micrometer),
the W1 and the P1 satisfying a relationship of $W1 \geq -647(1-W1/P1)+511$ and a relationship of $W1 \leq -882(1-W1/P1)+847$,
$(1-W1/P1)$ being not less than 0.55 and not more than 0.85, and
the W1 being not less than 75 μm and not more than 300 μm; and
an insulating layer provided on the first electrode, the insulating layer including
a plurality of insulating parts extending in the first direction and being arranged in the second direction, and
a plurality of openings provided between each of the insulating parts, each of the openings exposing a part of the first electrode,
the organic light emitting layer being provided on the insulating layer,
the first electrode having a plurality of exposed parts exposed by the openings, and
each of the conductive parts overlapping with any of the exposed parts when projected onto a plane parallel to the upper face.

2. The device according to claim 1, wherein
the W1 and the P1 further satisfy a relationship of $W1 \geq -647(1-W1/P1)+595$.

3. The device according to claim 1, further comprising a wiring layer provided between the first electrode and the organic light emitting layer and including a plurality of wiring parts, the wiring parts extending in the first direction and being arranged in the second direction, the wiring layer being light reflective and
when a length of the wiring parts in the second direction is set to Wh (micrometer), and
a pitch of a projected image of the conductive parts projected onto a plane parallel to the upper face and a projected image of the wiring parts projected onto the plane is set to Pp (micrometer),
the W1 and the Pp satisfying a relationship of $W1 \geq -647(1-W1/Pp)+511$, and
the Wh and the Pp satisfying a relationship of $Wh \geq -647(1-Wh/Pp)+511$.

4. The device according to claim 3, wherein
the wiring layer is electrically connected to the first electrode, and
an electric conductivity of the wiring layer is higher than an electric conductivity of the first electrode.

5. The device according to claim 1, wherein
a space between each of the conductive parts in the second direction is wider than a space between each of the insulating parts in the second direction.

6. The device according to claim 1, wherein the insulating layer is light transmissive.

7. The device according to claim 1, wherein
the organic light emitting layer includes:
a first layer;
a second layer provided between the first layer and the first electrode; and
a third layer provided between the first layer and the second electrode.

8. The device according to claim 1, wherein
the light emitting layer includes a plurality of light emitting parts; and
each of the light emitting parts is provided between each of the conductive parts and the first electrode.

9. The device according to claim 1, further comprising a first substrate, a second substrate, and a seal part,
the first substrate being light transmissive,
the first electrode being provided on the first substrate,
the second substrate being provided on the second electrode, and
the seal part being annularly provided along peripheries of the first substrate and the second substrate, the seal part sealing the first electrode, the organic light emitting layer, and the second electrode.

10. An organic electroluminescent device, comprising:
a first electrode having an upper face, the first electrode being light transmissive;
an organic light emitting layer provided on the first electrode;
a second electrode provided on the organic light emitting layer, the second electrode being light transmissive;
a first wiring layer provided between the first electrode and the organic light emitting layer and including a plurality of first wiring parts, the first wiring parts extending in a first direction parallel to the upper face and being arranged in a second direction, the second direction being parallel to the upper face and intersecting with the first direction, the first wiring layer being light reflective,
when a length of each of the first wiring parts in the second direction is set to Wh1 (micrometer), and
a pitch of each of the first wiring parts is set to Ph1 (micrometer),
the Wh1 and the Ph1 satisfying a relationship of $Wh1 \geq -647(1-Wh1/Ph1)+511$ and satisfying a relationship of $Wh1 \leq -882(1-Wh1/Ph1)+847$,
$(1-Wh1/Ph1)$ being not less than 055 and not more than 0.85, and
the Wh1 being not less than 75 μm and not more than 300 μm; and
an insulating layer provided on the first electrode, the insulating layer including a plurality of insulating parts extending in the first direction and being arranged in the second direction, and a plurality of openings provided between each of the insulating parts, each of the openings exposing a part of the first electrode, the organic light emitting ayer being provided on the insulating layer, the first electrode having a plurality of exposed parts exposed by the openings, and each of the conductive parts overlapping with any of the exposed parts when projected onto a plane parallel to the upper face.

11. The device according to claim 10, further comprising a second wiring layer provided on the second electrode and including a plurality of second wiring parts extending in the first direction and being arranged in the second direction, the second wiring layer being light reflective, and when a length of each of the second wiring parts in the second direction is set to (micrometer), and a pitch of a projected image of the first wiring parts projected onto a plane parallel to the upper face and a projected image of the second wiring parts projected onto plane is set to Pp (micrometer), the Wh1 and the Pp satisfying a relationship of $Wh1 \geq -647(1-Wh1/Pp)+511$, and the Wh2 and the Pp2 satisfying a relationship of $Wh2 \geq -647(1-Wh2/Pp)+511$.

12. An organic electroluminescent device, comprising:

a first electrode having an upper face, the first electrode being light transmissive;

an organic light emitting layer provided on the first electrode;

a second electrode provided on the organic light emitting layer, the second electrode being light transmissive;

a wiring layer provided on the second electrode and including a plurality of wiring parts, the wiring parts extending in a first direction parallel to the upper face and being arranged in a second direction, the second direction being parallel to the upper face and intersecting with the first direction, the wiring layer being light reflective, when a length of each of the wiring parts in the second direction is set to Wh micrometer), and a pitch of each of the wiring parts is set to Ph (micrometer), the Wh and the Ph satisfying a relationship of $Wh \geq -647(1-Wh/Ph)+511$ and satisfying a relationship of $Wh \leq -882(1-Wh/Ph)+847$, $(1-Wh/Ph)$ being not less than 0.55 and not more than 0.85, and the Wh being not less than 75 μm and not more than 300 μm; and an insulating layer provided on the first electrode, the insulating layer including a plurality of insulating parts extending in the first direction and being arranged in the second direction, and a plurality of openings provided between each of the insulating parts, each of the openings exposing apart of the first electrode, the organic light emitting layer being provided on the insulating layer, the first electrode having a plurality of exposed parts exposed by the openings, and each of the conductive parts overlapping with any of the exposed parts when projected onto a plane parallel to the upper face.

13. An illumination apparatus, comprising:
an organic electroluminescent device including:
a first electrode having an upper face, the first electrode being light transmissive, an organic light emitting layer provided on the first electrode, a second electrode provided on the organic light emitting layer and including a plurality of conductive parts, the conductive parts extending in a first direction and being arranged in a second direction, the second direction being parallel to the upper face and intersecting with the first direction, the second electrode being light reflective; and a power source being electrically connected to the first electrode and the second electrode and supplying a current to the organic light emitting layer via the first electrode and the second electrode, when a length of each of the conductive parts in the second direction is set to W1 (micrometer), and a pitch of each of the conductive parts is set to P1 (micrometer), the W1 and the P1 satisfying a relationship of $W1 \geq -647(1-W1/P1)+511$ and a relationship of $W1 \leq -882(1-W1/P1)+847$, $(1-W1/P1)$ being not less than 0.55 and not more than 0.85, and the W1 being not less than 75 μm and not more than 300 μm, wherein the organic electroluminescent device further includes an insulating layer provided on the first electrode, the insulating layer including a plurality of insulating parts extending in the first direction and being arranged in the second direction, and a plurality of openings provided between each of the insulating parts, each of the openings exposing a part of the first electrode, the organic light emitting layer being provided on the insulating layer, the first electrode having a plurality of exposed parts exposed by the openings, and each of the conductive parts overlapping with any of the exposed parts when projected onto a plane parallel to the upper face.

14. An illumination apparatus, comprising:
an organic electroluminescent device including:
a first electrode having an upper face, the first electrode being light transmissive, an organic light emitting layer provided on the first electrode, a second electrode provided on the organic light emitting layer, the second electrode being light transmissive, and a first wiring layer provided between the first electrode and the organic light emitting layer and including a plurality of first wiring parts, the first wiring parts extending in a first direction and being arranged in a second direction, the second direction being parallel to the upper face and intersecting with the first direction, the first wiring layer being light reflective; and a power source electrically connected to the first electrode and the second electrode and supplying a current to the organic light emitting layer via the first electrode and the second electrode, when a length of each of the first wiring parts in the second direction is set to Wh1 (micrometer), and a pitch of each of the first wiring parts is set to Ph1 (micrometer), the Wh1 and the Ph1 satisfying a relationship of Wh1≥−647(1−Wh1/Ph1)+511 and a relationship of Wh1≤−882(1−Wh1/Ph1)+847, (1−Wh1/Ph1) being not less than 0.55 and not more than 0.85, and the Wh1 being not less than 75 μm and not more than 300 μm, wherein the organic electroluminescent device further includes an insulating layer provided on the first electrode, the insulating layer including a plurality of insulating parts extending in the first direction and being arranged in the second direction, and a plurality of openings provided between each of the insulating parts, each of the openings exposing a part of the first electrode, the organic light emitting layer being provided on the insulating layer, the first electrode having a plurality of exposed parts exposed by the openings, and each of the conductive parts overlapping with any of the exposed parts when projected onto a plane parallel to the upper face.

15. An illumination apparatus, comprising:

an organic electroluminescent device including:

a first electrode having an upper face, the first electrode being light transmissive, an organic light emitting layer provided on the first electrode, a second electrode provided on the organic light emitting layer, the second electrode being light transmissive, and a wiring layer provided on the second electrode and including a plurality of wiring parts, the wiring parts extending in a first direction and being arranged in a second direction, the second direction being parallel to the upper face and intersecting with the first direction, the wiring layer being light reflective; and a power source electrically connected to the first electrode and the second electrode and supplying a current to the organic light emitting layer via the first electrode and the second electrode, when a length of each of the wiring parts in the second direction is set to Wh micrometer), and a pitch of each of the wiring parts is set to Ph (micrometer), the Wh and the Ph satisfying a relationship of Wh≥−647(1−Wh/Ph)+511 and a relationship of Wh≤−882(1−Wh/Ph)+847, (1−Wh/Ph) being not less than 0.55 and not more than 0.85, and the Wh being not less than 75 μm and not more than 300 μm, wherein the organic electroluminescent device further includes an insulating layer provided on the first electrode, the insulating layer including a plurality of insulating parts extending in the first direction and being arranged in the second direction, and a plurality of openings provided between each of the insulating parts, each of openings exposing, a part of the first electrode, the organic light emitting, layer being, provided on the insulating, layer, the first electrode having a plurality of exposed parts exposed by the openings, and each of the conductive parts overlapping, with any of the exposed parts when projected onto a plane parallel to the upper face.

16. An illumination system, comprising:

a plurality of organic electroluminescent devices, each of the organic electroluminescent devices including:

a first electrode having an upper face, the first electrode being light transmissive, an organic light emitting layer provided on the first electrode, and a second electrode provided on the organic light emitting layer and including a plurality of conductive parts, the conductive parts extending in a first direction parallel to the upper face and being arranged in a second direction, the second direction being parallel to the upper face and intersecting with the first direction, the second electrode being light reflective; and a controller electrically connected to each of the organic electroluminescent devices and controlling turning on and off of each of the organic electroluminescent devices, when a length of each of the conductive parts in the second direction is set to W1 (micrometer), and a pitch of each of the conductive parts is set to P1 (micrometer), the W1 and the P1 satisfying a relationship of W1≥−647(1−W1/P1)+511 and a relationship of W1≤−882(1−W1/P1)+847, (1−W1/P1) being not less than 0.55 and no more than 0.85, and the W1 being not less than 75 μm and not more than 300 μm, wherein each of the organic electroluminescent devices further includes an insulating layer provided on the first electrode, the insulating layer including a plurality of insulating pans extending in the first direction and being arranged in the second direction, and a plurality of openings provided between each of the insulating parts, each of the openings exposing a part of the first electrode, the organic light emitting layer being provided on the insulating layer, the first electrode having a plurality of exposed parts exposed by the openings, and each of the conductive parts overlapping with any of the exposed parts when projected onto a plane parallel to the upper face.

17. An illumination system, comprising:

a plurality of organic electroluminescent devices, each of the organic electroluminescent devices including:

a first electrode having an upper face, the first electrode being light transmissive, an organic light emitting layer provided on the first electrode, a second electrode provided on the organic light emitting layer, the second electrode being light transmissive, and a first wiring layer provided between the first electrode and the organic light emitting layer and including a plurality of first wiring parts, the first wiring parts extending in a first direction parallel to the upper face and being arranged in a second direction, the second direction being parallel to the upper face and intersecting with the first direction, the first wiring layer being light reflective; and a controller electrically connected to each of the organic electroluminescent devices and controlling turning on and off of each of the organic electroluminescent devices, when a length of each of the first wiring parts in the second direction is set to Wh1 (micrometer), and a pitch of each of the first wiring parts is set to Ph1 (micrometer), the Wh1 and the Ph1 satisfying a relationship of $Wh1 \leq -647(1-Wh1/Ph1)+847$, and a relationship of $Wh1 \leq -882(1-Wh1/Ph1)+847$, (1−Wh1/Ph1) being not less than 0.55 and not more than 0.85, and the Wh1 being not less than 75 μm and not more than 300 μm, wherein each of the organic electroluminescent devices further includes an insulating layer provided on the first electrode, the insulating layer including
 a plurality of insulating parts extending in the first direction and being arranged in the second direction; and
 a plurality of openings provided between each of the insulating parts, each of the openings exposing a part of the first electrode, the organic light emitting layer being provided on the insulating layer, the first electrode having a plurality of exposed parts exposed by the openings, and each of the conductive parts overlapping with any of the exposed parts when projected onto a plane parallel to the upper face.

18. An illumination system, comprising:

a plurality of organic electroluminescent devices, each of the organic electroluminescent devices including:
 a first electrode having an upper face, the first electrode being light transmissive,
 an organic light emitting layer provided on the first electrode,
 a second electrode provided on the organic light emitting layer, the second electrode being light transmissive, and
 a wiring layer provided on the second electrode and including a plurality of wiring parts, the wiring parts extending in a first direction parallel to the upper face and being arranged in a second direction, the second direction being parallel to the upper face and intersecting with the first direction, the wiring layer being light reflective; and a controller electrically connected to each of the organic electroluminescent devices and controlling turning on and off of each of the organic electroluminescent devices, when a length of each of the wiring parts in the second direction is set to Wh (micrometer), and a pitch of each of the wiring parts is set to Ph (micrometer), the Wh and the Ph satisfying a relationship of $Wh \geq -647(1-Wh/Ph)+511$ and a relationship of $Wh \leq -882(1-Wh/Ph)+847$, (1−Wh/Ph) being not less than 0.55 and not more than 0.85, and the Wh being not less than 75 μm and not more than 300 μm, wherein each of the organic electroluminescent devices further includes an insulating layer provided on the first electrode, the insulating layer including
 a plurality of insulating parts extending in the first direction and being arranged in the second direction, and
 a plurality of openings provided between each of the insulating parts, each of the openings exposing a part of the first electrode, the organic light emitting layer being provided on the insulating layer, the first electrode having a plurality of exposed parts exposed by the openings, and each of the conductive parts overlapping with any of the exposed parts when projected onto a plane parallel to the upper face.

* * * * *